United States Patent
Lee et al.

(10) Patent No.: US 11,829,281 B2
(45) Date of Patent: Nov. 28, 2023

(54) SEMI RECEIVER SIDE WRITE TRAINING FOR NON-VOLATILE MEMORY SYSTEM

(71) Applicant: SanDisk Technologies LLC, Addison, TX (US)

(72) Inventors: Jang Woo Lee, Seongnam-si (KR); Srinivas Rajendra, Milpitas, CA (US); Anil Pai, San Jose, CA (US); Venkatesh Ramachandra, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 344 days.

(21) Appl. No.: 17/348,910

(22) Filed: Jun. 16, 2021

(65) Prior Publication Data

US 2022/0405190 A1    Dec. 22, 2022

(51) Int. Cl.
*G06F 11/36* (2006.01)
*G11C 7/10* (2006.01)
*G06F 18/214* (2023.01)
*G06F 13/16* (2006.01)
*G06F 3/06* (2006.01)

(52) U.S. Cl.
CPC ........ *G06F 11/368* (2013.01); *G06F 13/1689* (2013.01); *G06F 18/214* (2023.01); *G11C 7/1096* (2013.01); *G06F 3/061* (2013.01); *G11C 2207/2254* (2013.01)

(58) Field of Classification Search
CPC .... G06F 11/368; G06F 13/1689; G06F 3/061; G11C 7/1096; G11C 2207/2254
See application file for complete search history.

(56) References Cited

U.S. PATENT DOCUMENTS

| | | | |
|---|---|---|---|
| 8,081,527 B1 | 12/2011 | Venkataraman et al. | |
| 10,297,311 B1* | 5/2019 | Yuan | G11C 11/4096 |
| 10,447,247 B1 | 10/2019 | Tang et al. | |
| 10,496,332 B2 | 12/2019 | Srivastava et al. | |
| 10,530,347 B2 | 1/2020 | Tang et al. | |
| 10,587,247 B2 | 3/2020 | Tang et al. | |
| 10,659,215 B1* | 5/2020 | Wang | G11C 7/1084 |
| 10,861,517 B1 | 12/2020 | Maccarrone et al. | |

(Continued)

OTHER PUBLICATIONS

ONFI, "Open NAND Flash Interface Specification," Revision 4.2, [www.onfi.org]. Feb. 12, 2020, 340 pages.

*Primary Examiner* — Douglas King
(74) *Attorney, Agent, or Firm* — Vierra Magen Marcus LLP

(57) ABSTRACT

Technology is disclosed herein for semi receiver side write training in a non-volatile memory system. The transmitting device has delay taps that control the delay between a data strobe signal and data signals sent on the communication bus. The delay taps on the transmitting device are more precise that can typically be fabricated on the receiving device (e.g., NAND memory die). However, the receiving device performs the comparisons between test data and expected data, which alleviates the need to read back the test data. After the different delays have been tested, the receiving device informs the transmitting device of the shortest and longest delays for which data was validly received. The transmitting device then sets the delay taps based on this information. Moreover, the write training can be performed in parallel on many receiving devices, which is very efficient.

20 Claims, 13 Drawing Sheets

(56) References Cited

U.S. PATENT DOCUMENTS

| | | | |
|---|---|---|---|
| 2004/0123207 A1* | 6/2004 | Zumkehr | G11C 7/1066 |
| | | | 714/744 |
| 2006/0052961 A1 | 3/2006 | Best | |
| 2006/0164909 A1* | 7/2006 | Gower | G11C 7/1048 |
| | | | 365/194 |
| 2010/0254270 A1* | 10/2010 | Lee | G06F 13/1689 |
| | | | 370/250 |
| 2012/0296598 A1* | 11/2012 | Chafin | G11C 29/023 |
| | | | 702/125 |
| 2014/0013070 A1* | 1/2014 | Toronyi | G11C 7/04 |
| | | | 711/167 |
| 2014/0181429 A1* | 6/2014 | Malladi | G06F 11/0751 |
| | | | 711/154 |
| 2018/0175834 A1 | 6/2018 | Modi et al. | |
| 2019/0296723 A1 | 9/2019 | Tang et al. | |
| 2020/0133540 A1* | 4/2020 | Pilolli | G11C 29/022 |

* cited by examiner

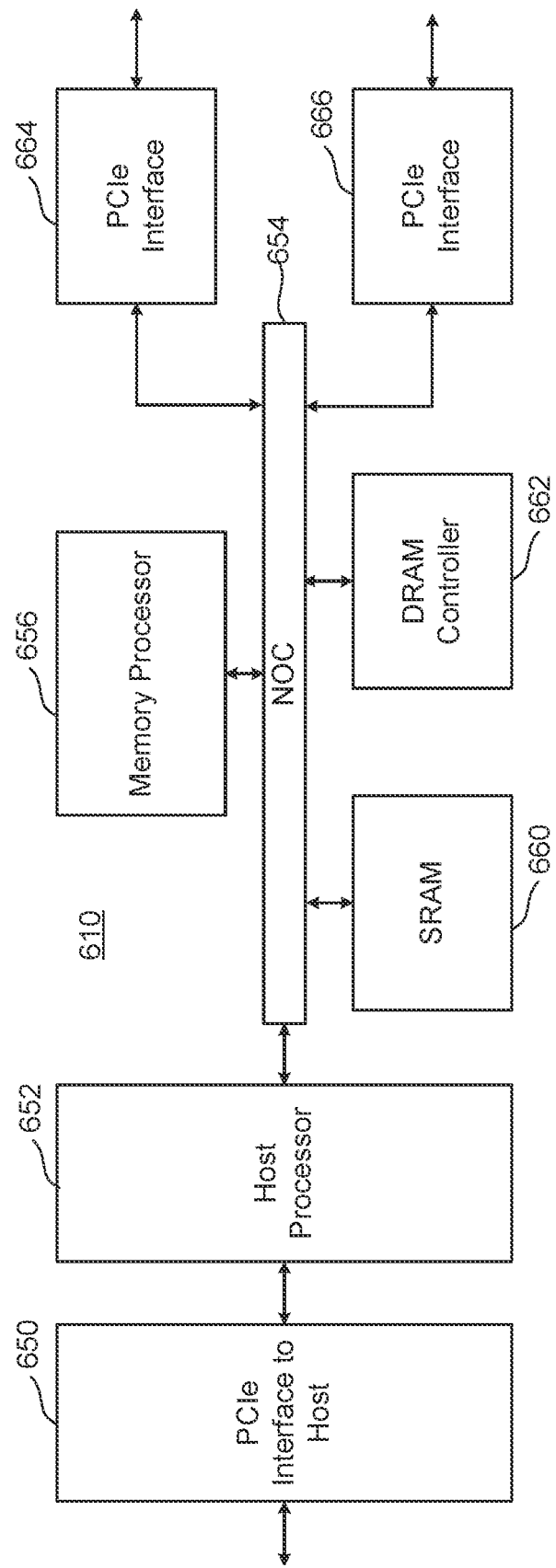

SEMI RECEIVER SIDE WRITE TRAINING FOR NON-VOLATILE MEMORY SYSTEM

BACKGROUND

In source synchronous systems, a transmitting device sends both data signals carrying data and a clock signal to a receiving device. The clock signal is sometimes referred to as a data strobe signal. The receiving device uses the clock signal to identify data values of the data carried by the data signals. In particular, the receiving device identifies levels of data pulses in response to detecting transitions of the clock signal. A deviation of the clock transitions from their optimal times is referred to as skew between the clock signal and the data signal. Too large of skew between the data signals and clock signal may cause the receiving circuit to incorrectly identify the levels of the data pulses. Increases in frequency of the data and clock signals magnify the skew problem.

A write training process may be used to calibrate delays between the clock signal and the data signals, which helps to provide a wider data valid window. The write training process typically includes trying a number of different delays between the data signals and clock signal, which can be time consuming.

Some specifications, such as the Open NAND Flash Interface (ONFI) Specification, describe procedures for write DQ training. The ONFI specification describes write DQ training at the transmitter (Tx) side, as well as optional write DQ training at the receiver (Rx) side (see Open NAND Flash Interface Specification, Revision 4.2, Feb. 12, 2020). As an example, the transmitter could include a memory controller, and the receiver could include a semiconductor die containing NAND memory cells.

For ONFI Tx side write training, the Tx side sends test data to the Rx side. Then, the test data is transferred back from the Rx to the Tx. The Tx then compares the test data that was read back to the expected data to see if further training (DQ delay) is needed. Therefore, the Tx side training can be slow due to, for example, the need to transfer test data back from the Rx to the Tx.

For ONFI Rx side write training, the Rx side may compare the test data it received from the Tx with expected data. The Rx side may adjust the DQ delays to achieve the widest data valid window. However, the circuitry on the Rx side might not be able to achieve a high resolution in the delays. This is due to typical limitations in the semiconductor process used to fabricate the Rx (e.g., NAND memory die). Therefore, Rx side write training can suffer from lack of precision. As the frequency of data transmission becomes greater, low precision in the DQ delays makes it challenging to implement Rx side write training.

BRIEF DESCRIPTION OF THE DRAWINGS

Like-numbered elements refer to common components in the different Figures.

FIG. 6B is a block diagram of one embodiment of a Front End Processor Circuit. In some embodiments, the Front End Processor Circuit is part of a Controller.

DETAILED DESCRIPTION

Technology is disclosed herein for write training in a non-volatile memory system. The write training may be referred to as semi-receiver side write training. In an embodiment, the transmitting device has delay taps that control the delay between the data strobe signal and the data signals that are sent on the communication bus. The transmitting device may include a semiconductor die that contains a memory controller. Moreover, the delay taps on the transmitting device are more precise that can typically be fabricated on the receiving device (e.g., NAND memory die). However, the receiving device performs the comparisons between the test data and the expected data, which alleviates the need to read back the test data. After the different delays have been tested, the receiving device informs the transmitting device of the shortest and longest delays for which data was validly received. The transmitting device then sets the delay taps, which are on the transmitting device, based on this information. Moreover, the write training can be performed in parallel on many receiving devices, which is very efficient. Hence, semi-receiver side write training is faster than transmitting side training, and can have a finer delay resolution than receiving side write training. Having a finer delay resolution is especially important as the transmission speeds over the communication bus increase. If the delay resolution is not high enough write training may fail. Therefore, write training in which the receiver side (e.g., NAND memory die) has delay taps to control the delay may fail if the transmission speed is too high.

Figure 1:
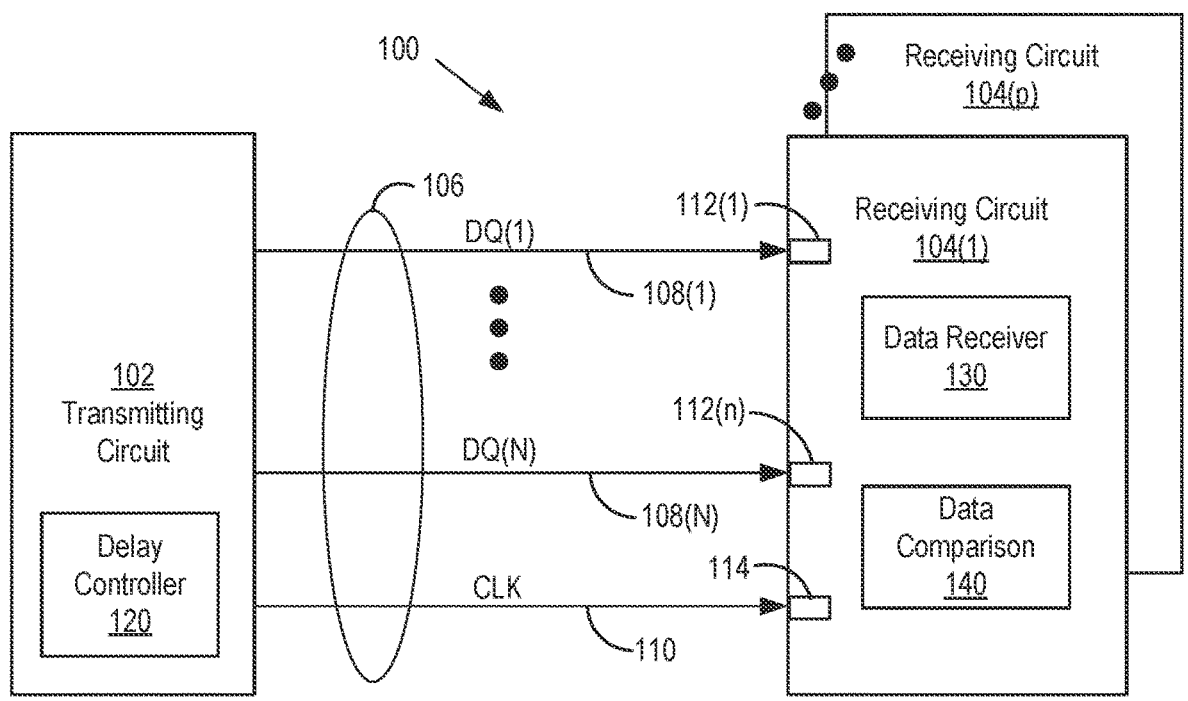
FIG. 1 is a block diagram of an example system that includes a transmitting circuit and a receiving circuit.

FIG. 1 shows one embodiment of a memory system 100 in which write training may be performed. The memory system 100 includes a transmitting circuit 102 and a number of receiving circuits 104(1)-104(p). The transmitting circuit 102 and each respective receiving circuit 104 are configured to communicate with each other via a communications bus 106. The following discussion will use the reference number 104 to refer to any of the receiving circuits. Both the transmitting circuit 102 and the receiver circuit 104 may be transceiver circuits, which can be configured to transmit and receive signals.

Additionally, in some embodiments, each of the transmitting circuit 102 and the receiving circuits 104 are integrated circuits (IC). In general, an integrated circuit (IC)—also referred to as a monolithic IC, a chip, or a microchip—is an assembly or a collection of electric circuit components (including active components, such as transistors and diodes, and passive components, such as capacitors and resistors) and their interconnections formed as a single unit, such as by being fabricated, on a substrate typically made of a semiconductor material such as silicon. For such embodiments, the transmitting circuit 102 and the receiving circuits 104 are separate integrated circuits, and the communication bus 106 is configured to communicate signals external to the separate transmitting circuit (IC) 102 and the receiving circuits (IC) 104. In some embodiments, each receiving circuit 104 contains a memory structure having non-volatile memory cells, and the transmitting circuit 102 contains a memory controller. In some embodiments, each receiving circuit 104 contains a control circuit that is configured to connect to a memory structure that resides on a separate IC from the receiving circuit 104.

The transmitting circuit 102 is configured to send a clock signal CLK and a plurality of data signals DQ to one or more receiving circuits 104 via a communications bus 106. Hence, a receiving circuit 104 is configured to receive the clock signal CLK and a plurality data signals DQ from the transmitting circuit 102 via the communications bus 106. The plurality of data signals DQ are shown in FIG. 1 as including data signals DQ(1) to DQ(N), where N is two or more. As an example, N is 8, although other integer numbers of two or more may be possible for other configurations. The clock signal may also be referred to herein as a data strobe signal.

During an embodiment of semi receiver side write training, the clock signal CLK and the data signals DQ may be sent to all of the receiving circuits 104, such that write training is performed in parallel. During normal operation, the transmitting circuit 102 may send user (as DQ signals) and the CLK to a selected receiving circuit 104, such that the user data may be stored in non-volatile memory cells.

From the perspective of the transmitting circuit 102, the clock signal CLK is an output clock signal, and the data signals DQ are output data signals in that they are the clock and data signals that the transmitting circuit 102 outputs to the receiving circuit 104. From the perspective of the receiving circuit 104, the clock signal CLK is an input clock signal, and the data signals DQ are input data signals in that they are the clock and data signals that the receiving circuit 104 receives from the transmitting circuit 102.

The communications bus 106 includes data lines 108(1) to 108(N) between the transmitting circuit 102 and the receiving circuit 104. The receiving circuit 104 has data contacts 112(1) to 112(N), which are in physical and electrical contact with the respective data lines 108(1) to 108(N). The data contacts 112(1) to 112(N) could be pins, pads, etc. The transmitting circuit 102 is configured to send the data signals DQ(1) to DQ(N) simultaneously and/or in parallel over the data lines 108(1) to 108(N) to the receiving circuit 104. Otherwise stated, the receiving circuit 104 is configured to receive the data signals DQ(1) to DQ(N) simultaneously and/or in parallel from over the data lines 108(1) to 108(N).

In addition, the communications bus 106 includes one or more clock lines 110 between the transmitting circuit 102 and the receiving circuit 104. The clock line(s) may also be referred to herein as a data strobe line. The receiving circuits each have one or more clock input contacts 114, which is/are in physical and electrical contact with the respective one or more clock lines 110. The clock input contact(s) could be pins, pads, etc. The input clock signal CLK may include a single-ended clock signal or a pair of complementary clock signals (e.g., CLK and CLKB). Where the input clock signal CLK is a single-ended clock signal, the one or more clock lines 110 may include a single clock line. Where the input clock signal CLK is a pair of complementary clock signals CLK, CLKB, the one or more clock lines 110 may include two clock lines. The transmitting circuit 102 may be configured to transmit each clock signal CLK, CLKB of the complementary pair over a respective one of the two clock lines 110. Each receiving circuit 104 is configured to receive the input clock signal CLK—either as a single-ended clock signal or as a pair of complementary clock signals—simultaneously and/or in parallel with the input of data signals DQ(1) to DQ(N).

The transmitting circuit 102 and the receiving circuits 104 form a source synchronous system. A source synchronous system is a system in which a transmitting (or source) circuit sends a data signal along with a clock signal to a receiving (or destination) circuit in order for the receiving circuit to use the clock signal to identify the data values of the data signal.

The transmitting circuit has a delay controller 120, which is configured to control a delay between CLK and each respective data signal DQ(1)-DQ(N). Moreover, the delays can be independently controlled for each receiving circuit 104(1)-104(p). In an embodiment of write training, all of the receiving circuits 104(1)-104(p) are trained in parallel, which provides for efficient write training. The delay controller 120 scans through a number of delays during write training. That is, the delay controller 120 sets the delays to a certain value, and then sends test data to the receiving circuits 104. Then, the delay controller 120 sets the delays to another value, and then again sends the test data to the receiving circuits 104. This process of using different delays is repeated for a number of delays, which may be referred to herein as "scanning delay values."

Each receiving circuit 104 has a data receiver 130, which is configured to receive the data signals. Briefly, the data receiver 130 may contain on-die termination (ODT), a data receiver, and a data latch for each data path. The purpose of the data receiver 130 is thus to identity the data in the data signal for each respective data line.

The data compare logic 140 in the receiving circuits 104 is used during an embodiment of semi-receiver side write training. The purpose of the data comparison is to compare the data that is identified by the data receiver 130 with expected data during write training. Thus, the data compare logic 140 determines whether the data was validly received. By "validly received" it is meant that the data that is identified by the data receiver 130 matches the expected data.

Figure 2:
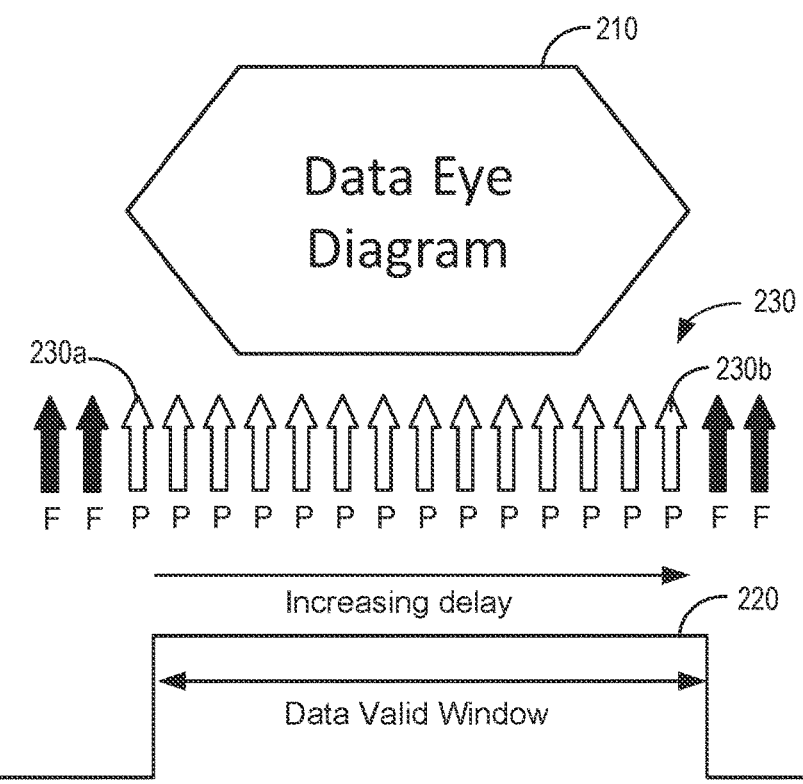
FIG. 2 shows a data eye diagram and corresponding data valid window.

After all of the delays have been scanned during an embodiment of write training, each receiving circuit 104 reports to the transmitting circuit 102 the delays for which data was validly received. In one embodiment, data eye information is reported. FIG. 2 will be referred to illustrate reporting information during write training. FIG. 2 shows a data eye diagram 210 for a data path associated with one of the data lines 108. A data path includes a data line used to transmit a data signal, as well as circuitry inside of the transmitting circuit 102 and the receiving circuit 104 that process that data signal.

A data valid window 220 is depicted in FIG. 2. The arrows 230 below the data eye diagram 210 correspond to different delays between CLK and DQ (for one data path). Arrows labeled with a "P" indicate "pass" or that data was validly received for that delay. Arrows labeled with a "F" indicate "fail" or that data was not validly received for that delay. The shortest delay is on the left, with the delays getting progressively longer moving to the right. Hence, there is a range of delays for which data was validly received. The range includes a shortest delay 230a for which data was validly received, and a longest delay 230b for which data was validly received. In one embodiment, the receiving circuit 104 reports the shortest delay 230a and the longest delay 230b to the transmitting circuit 102.

Returning again to the discussion of FIG. 1, the transmitting circuit 102 sets delay values for each data line 108 based on the shortest delay 230a and the longest delay 230b. This is done separately for each receiving circuit 104(1)-104(p). In one embodiment, the transmitting circuit 102 sets delay taps. For example, the transmitting circuit 102 may set a delay tap for each data line 108(1)-108(n) for each receiving circuit 104(1)-104(p).

Figure 3:
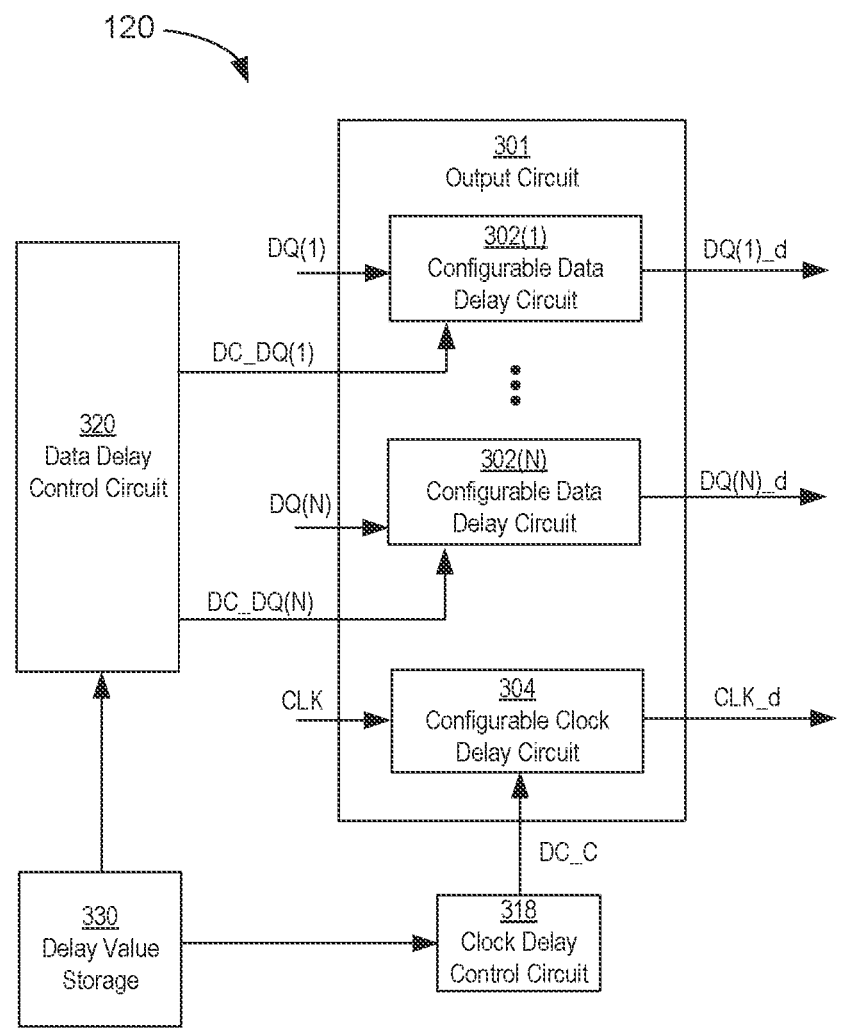
FIG. 3 is a block diagram of one embodiment of a delay controller of the transmitting circuit.

FIG. 3 is a block diagram of one embodiment of delay controller of the transmitting circuit 102. The delay controller 120 has an output circuit 301, which receives a number of data signals DQ(1)-DQ(N), as well as a clock signal CLK. The output circuit 301 includes configurable data delay circuits 302(1)-302(n), which are each able to provide a configurable amount of delay for each data signal DQ(1)-DQ(N). Since different data signals DQ may have different amounts of skew relative to the clock signal CLK, the delay controller 120 is configured to independently control or adjust the delay of each of the data signals DQ. The output circuit 301 also includes a configurable clock delay circuit 304 which is able to provide a configurable amount of delay for the clock signal CLK. The delay controller 120 has data delay control circuit 320, which outputs delay control signals DC_DQ(1) to DC_DQ(N) to control the delays of the configurable data delay circuits 302(1)-302(n). The configurable data delay circuits 302(1)-302(n) may also be referred to herein as delay taps.

The delay controller 120 has clock delay control circuit 318, which outputs clock delay control signal DC_C to control the delay of the configurable clock delay circuit 304. The delay control signals DC_DQ and DC_C may be analog signals or digital signals. For configurations in which the delay control signals DC are digital signals, the delay control signals DC may be digital codes. Each digital code may represent a p-bit binary number, where p is the number of digits of the p-bit binary number, and where each digit can be a logic 0 value or a logic 1 value. The given configurable delay circuit may respond to the digital code by delaying its respective data or clock signal by a delay amount that corresponds to the current value of the p-bit number represented by the digital code. Briefly, the delayed signals DQ(1)_d to DQ(N)_d from the output circuit 301 sent over the data lines 108(1)-108(n). Not depicted in FIG. 3 are elements such as output drivers.

The delay value storage 330 stores delay values. In some embodiments, a delay value is stored for each configurable data delay circuit 302 for each receiving circuit 104. For example, the delay value storage 330 stores separate delay values for delay circuit 302(1) for each receiving circuit 104. Hence, when the transmitting circuit 102 is sending data to a given receiver circuit 104 during normal operation, the delay controller 120 selects the appropriate delay for the selected receiving circuit 104. During embodiments of semi receiver side write training, the delay values are calibrated and stored in the delay value storage 330. The delay value storage 330 may also store delay values for the configurable clock delay circuit 304. In one embodiment, a clock delay value is stored for each receiving circuit 104.

The precision of the delays provided by the delay controller 120 may be significantly greater than would typically be possible if delay circuitry were to be implemented on the receiving circuit (e.g., NAND memory die). One reason for this is that different semiconductor fabrication techniques may be used for the semiconductor die that contains the transmitting circuit 102 and the semiconductor die that contains the receiving circuit 104. For example, the semiconductor fabrication techniques used to form a semiconductor die that contains the receiving circuit 104 may be tailored to form high density memory structures, such as three-dimensional NAND memory arrays. It can be difficult to fabricate high precision delay circuitry when using such semiconductor fabrication techniques. Therefore, embodiments in which the delay controller 120 resides on a semiconductor die that contains, for example, a memory controller, can have higher precision in the delays. Higher precision in the delays becomes more important as data transmission across the communication bus 106 increases.

The delay controller 120 may comprise hardware, firmware (or software), or a combination of hardware and firmware (or software). For example, the delay controller 120 may include or be a component of an integrated circuit (IC), such as an application specific integrated circuit (ASIC) or a field programmable gate array (FPGA), a circuit, a digital logic circuit, an analog circuit, a combination of discrete circuits, gates, or any other type of hardware or combination thereof. In addition, or alternatively, a delay controller 120 may include memory hardware that comprises instructions executable with a processor or processor circuitry to implement one or more of the features of the delay controller.

Figure 4:
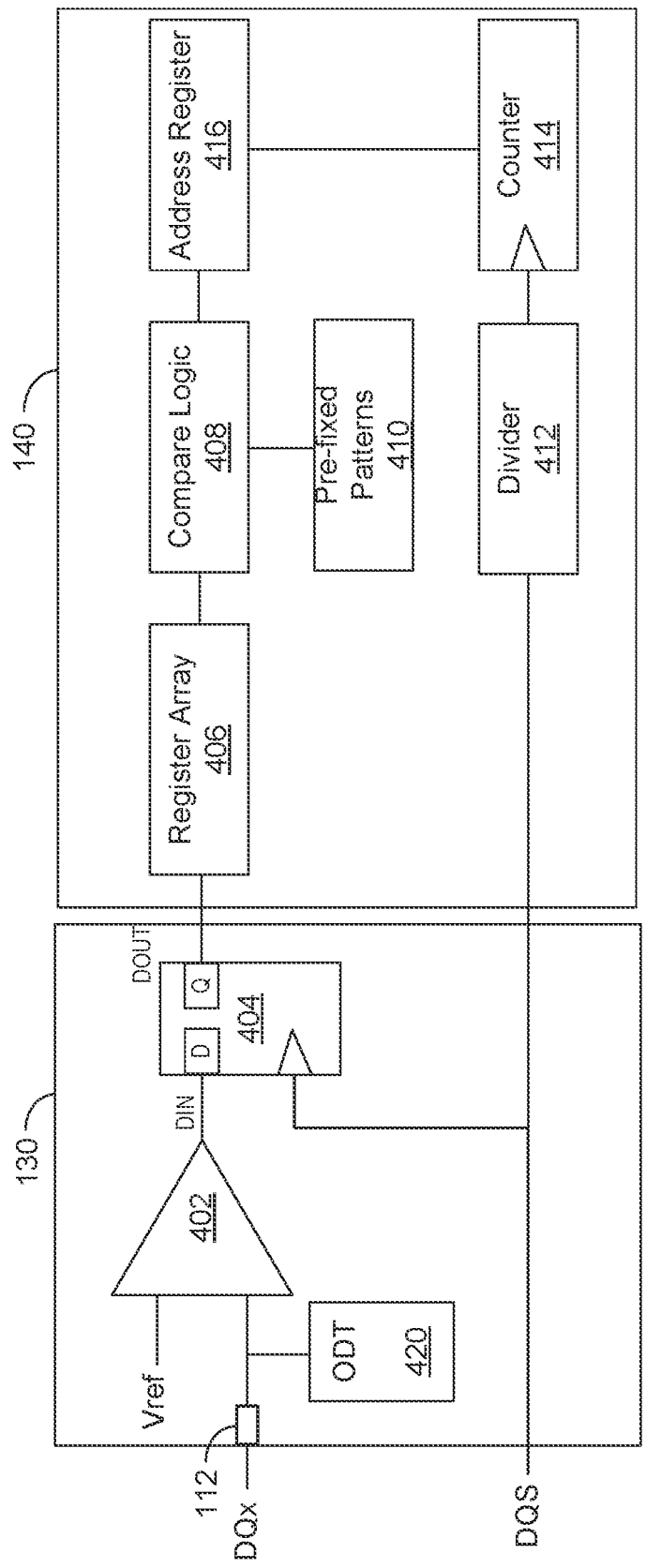
FIG. 4 depicts one embodiment of a data receiver and a data comparison circuit of the receiving circuit.

FIG. 4 depicts one embodiment of data receiver 130 and data compare logic 140 of a receiving circuit 104. The receiving circuit 104 has separate data receiver 130 for each data path. For example, there is a separate data receiver 130 for each input data signal D1(1) to DQ(N). There may also be a separate data compare logic 140 for each data path.

The data receiver 130 has on-die termination (ODT) 420 connected to the data contact 112. The ODT 420 includes one or more termination resistors for impedance matching to the data line 108 to which the ODT 420 is connected. In one embodiments, the ODT 420 includes center tap termination. In one embodiment, the ODT 420 includes low voltage termination logic.

The data receiver 130 has a data buffer 402 that has one input connected to the data contact 112 (as well as ODT 420) and another input that receives a reference voltage (Vref). The data receiver 130 compares the data signal with Vref and outputs a result based on the comparison. For example, if the magnitude of the data signal is greater than Vref, then the data buffer 402 outputs a high magnitude voltage, and if the magnitude of the data signal is less than Vref, then the data buffer 402 outputs a low magnitude voltage. The output of the data buffer 402 is provided to sampling circuit 404.

The sampling circuit 404 performs sampling actions to identify data values of data carried by the input data signal DQ. As used herein, a sampling action is an action performed to determine, identify, detect, capture, obtain, or latch onto, a level or magnitude of a signal at a given point in time. A sampling circuit may include an input terminal configured to receive the data signal. In addition, a sampling circuit may output or present the level of the input signal that it identifies. The sampling circuit may do so by generating an output signal at an output terminal of the sampling circuit at a level that indicates or corresponds to the level of the input signal. Accordingly, a sampling circuit samples an input signal, samples a level of the input signal, and outputs an output signal at a level indicating the level of the input signal.

In addition, a sampling circuit performs sampling actions in response to detecting a transitions in a clock (e.g., DQS). The clock transition may be a rising transition or a falling transition, although in some embodiments, sampling transitions may include both rising transitions and falling transitions. Each time a sampling circuit detects a clock transition, the sampling circuit samples the input signal. The input signal that a sampling circuit samples is referred to as its input data signal, and the output signal that a sampling circuit generates and outputs in response to performing sampling actions on the input signal is referred to as its output data signal.

An example sampling circuit is a flip flop, such a D flip flop for example. The sampling circuit 404 includes a data input terminal or node D, a data output terminal or node Q, and a clock input terminal (identified by the triangle in FIG. 4). The data input terminal D is configured to receive an input data signal DIN, which the sampling circuit 404 is configured to sample. The clock input terminal is configured to receive a clock signal CLK of which the sampling circuit 404 is configured to detect sampling transitions. The data output terminal Q is configured to output an output data signal DOUT at levels and at times based on the levels of the input data signal DIN and the sampling transitions of the clock signal CLK. In particular, the sampling circuit 404 is configured to detect when each of the sampling transitions of the clock signal CLK occur. When the sampling circuit 404 detects that a sampling transition occurs, the sampling circuit 404 samples the level of the input data signal DIN at the data input terminal D, and generates the output data signal DOUT at the level of the input data signal DIN. The sampling circuit 404 maintains or holds the output data signal DOUT at the data output terminal Q at the level it identified until it detects the next sampling transition of the clock signal CLK. Upon detecting the next sampling transition of the clock signal CLK, the sampling circuit 404 will again identify the level of the input data signal DIN at the data input terminal D, and generate the output data signal DOUT at the level of the input data signal DIN in response to the next sampling transition. The sampling circuit 404 may continue to operate in this manner as it continues to receive additional data pulses of the input data signal DIN and detect sampling transitions of the clock signal CLK.

The data compare logic 140 will now be discussed. The data compare logic 140 is used during embodiments of semi receiver side write training to compare data that was identified by the sampling circuit 404 with expected data. The expected data may be provided ahead of time by the transmitting circuit 102 and stored in the pre-fixed patterns 410. Thus, pre-fixed patterns 410 is non-transitory storage, and could include volatile memory or non-volatile memory. In some embodiments, the transmitting circuit 102 provides a seed pattern, from which the receiving circuit 104 generates the pre-fixed patterns.

The register array 406 is used to store data that was identified by the sampling circuit 404. Hence, the register array 406 is non-transitory storage, and could include volatile memory or non-volatile memory. The compare logic 408 compares the data in the register array with the appropriate pre-fixed patterns 410 to determine whether the data was validly received. For example, the compare logic 408 determines whether the data signal is in the data valid window (see FIG. 2). That is, if the data in the register array 406 matches the pre-fixed patterns 410, then the data was validly received. In some embodiments, the compare logic 408 includes an XOR logic gate circuit to identify any sampling errors. The XOR gate may compare data from the register array 406 with data from the pre-fixed patterns 410. A sampling error refers to a case in which the sampling circuit 404 failed to properly identify the data in the data signal.

The address register 416 is used to store the delay values for which the data was validly received. Thus, in this context, an address corresponds to a delay value. For example, there might be 128 different delays used during the writing training, with each delay corresponding to a unique address. In one embodiment, the address register 416 is used to store the shortest delay for which the data was validly received and the longest delay for which the data was validly received (which may also be referred to as a data valid window). In one embodiment, this is implemented by storing two addresses. That is, the lowest address and the highest address for which the data was validly received may be stored in the address register 416.

The divider 412 is used to divide the data strobe signal (DQS). The divider 412 provides the divided clock to a counter 414. The counter 414 keeps track of the delays (or addresses). During the write training there will be a certain pre-determined number of DQS cycles for each delay. The divider 412 is configured to cause the counter 414 to increment once each time that the delay is changed. For example, if there are 2048 DQS cycles for each delay value, the divider 412 may divide DQS by 2048. In this manner, the counter 414 keeps track of what delay is being tested. As noted above, these different delays may also be referred to herein as addresses. In an embodiment, the receiver circuit 104 will report to the transmitting circuit 102 the lowest address and the highest address for which the data was validly received. This information may be reported for each data line 108(1)-108(n).

The data receiver 130 and data compare logic 140 may each comprise hardware, firmware (or software), or a combination of hardware and firmware (or software). For example, data receiver 130 and data compare logic 140 may include or be a component of an integrated circuit (IC), such as an application specific integrated circuit (ASIC) or a field programmable gate array (FPGA), a circuit, a digital logic circuit, an analog circuit, a combination of discrete circuits, gates, or any other type of hardware or combination thereof.

In general, a signal, such as the input clock signal CLK and the input data signals DQ may be at a level at a given point in time. As used herein, a level of a signal is a magnitude value, such as a voltage magnitude value or a current magnitude value. In some cases, the signal may be referred to as being at a high level or at a low level, transitioning between a high level and a low level, or transitioning between a low level and a high level. A high level of a signal may be a single high level, a level that is within a set or range of high levels, a maximum high level or a minimum high level of a set or range of high levels, or an average high level of a set or range of high levels. Similarly, a low level of a signal may be a single low level, a level that is within a set or range of low levels, a maximum low level or a minimum low level of a set or range of low levels, or an average low level of a set or range of low levels.

Figure 5A:
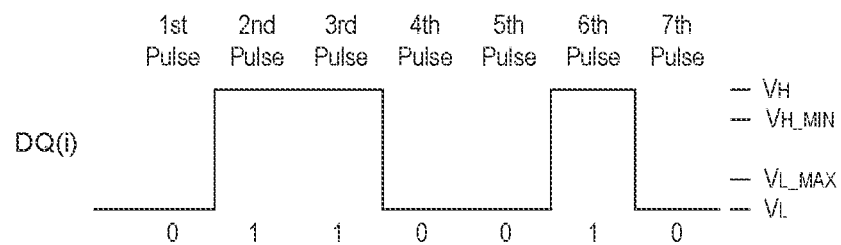
FIG. 5A is an example timing diagram of a data signal.

With reference to FIG. 5A, a high level of a signal is a level that is at or above a minimum high level $V_{H\_MIN}$, and a low level of the signal is a level that is at or below a maximum low level $V_{L\_MAX}$. The minimum high level $V_{H\_MIN}$ and the maximum low level $V_{L\_MIN}$ may be predetermined levels or values, and in particular example configurations, predetermined levels or values specified as part of a swing requirement with which the transmitting circuit 102 is configured to comply when transmitting the signal. A signal that transitions according to and/or in compliance with the swing requirement transitions to a high level that is at or above the minimum high level $V_{H\_MIN}$ of the swing requirement, and transitions to a low level that is at or below the maximum low level $V_{L\_MAX}$ of the swing requirement.

In general, a signal performs transitions between its high level and its low level. A given transition of a signal may be one of two transition types, including a rising transition and a falling transition. A signal performs a rising transition when the signal transitions from its low level to its high level, and performs a falling transition when the signal transitions from its high level to its low level.

A portion of a magnitude waveform of a signal over a transition is referred to as an edge. In particular, a portion of the magnitude waveform over a rising transition is a rising edge and a portion of the magnitude waveform over a falling transition is a falling edge.

Also, a clock signal, such as the input clock signal CLK, is a signal that has repetitive cycles occurring over successive periods T. Within a cycle, one of the portions is at a high level and the other portion is at a low level. Accordingly, the portions may be defined by consecutive rising and falling transitions or edges of the clock signal. For example, a given rising edge or a given falling edge may define or mark a boundary when one portion ends and a next portion, either of the same cycle or of a next cycle, begins.

In addition, a clock signal may include clock pulses that are formed or defined by the rising and falling edges of the clock signal. In particular example configurations, the clock pulses of a clock signal correspond to the high level of the clock signal, in that each clock pulse is defined by a rising edge followed by a period where the clock signal is at its high level, and then followed by a falling edge. A pulse width of a given clock pulse is a time duration extending from a time that the magnitude of the rising edge of the clock pulse is at or rises to a predetermined level (e.g., 50% of the high level) to a time that the magnitude of the falling edge of the clock pulse is at or falls to the predetermined level. The clock pulses of the clock signal may occur according to the frequency of the clock signal.

Additionally, a data signal is a signal that carries and/or includes data. The data carried by and/or included in a data signal includes a sequence of bits, where each bit includes or has a single-bit logic value of "1" or "0". The data signal may include a series or sequence of data pulses corresponding to a bit sequence of the data. Each data pulse may be at a level that indicates a data value, otherwise referred to as a logic level or a logic value. In addition, each data value is represented by a binary number or a binary value that includes one or more digits corresponding to and/or representing the one or more bits of the bit sequence. A duration of a data pulse is an amount of time that the level of the data pulse indicates the data value that the data pulse represents.

Figure 5B:
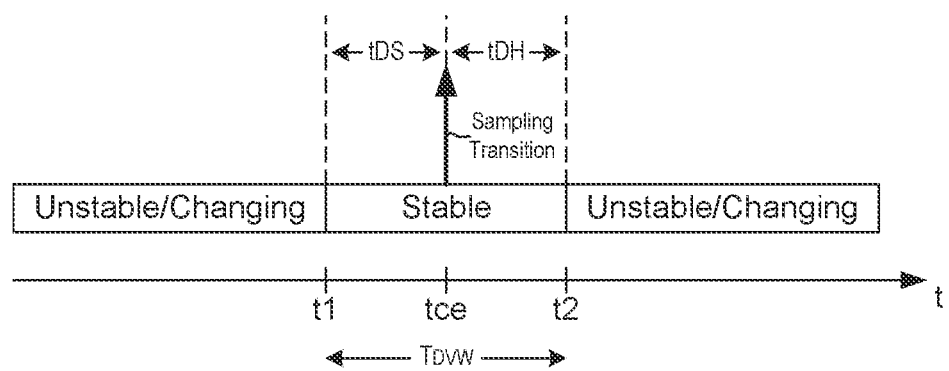
FIG. 5B is a schematic diagram of setup and hold time requirements.

FIG. 5B is a schematic diagram illustrating setup time and hold time requirements of the sampling circuit 404. A sampling transition of the clock signal CLK is shown as occurring at a clock event time tce. An occurrence of a sampling transition of the clock signal CLK may be referred to as a clock event. When the sampling circuit 404 detects a sampling transition, it detects a clock event. A time duration from a first time t1 to the clock event time tce denotes the setup time tDS, and a time duration from the clock event time tce to a second time denotes the hold time tDH. In order to meet the setup and hold requirements of the sampling circuit 404, the level of a data pulse of the input data signal DIN should be stable from the first time t1 to the second time t2. A setup violation occurs when the level of input data signal DIN is unstable (it is still changing) after the first time t1 occurs. In other words, a setup violation occurs when the actual amount of time that the level of the input data signal DIN is stable before occurrence of the sampling transition at the clock event time tce is less than the amount of the setup time tDS. In addition, a hold violation occurs when the level of the input data signal DIN is unstable (it changes) before the second time t2. In other words, a hold violation occurs when the actual amount of time that the level of the input data signal DIN is stable after occurrence of the sampling transition at the clock event time tce is less than the amount of the hold time tDH.

For a data pulse of the input data signal DIN, at least a portion of the duration that a level of the data pulse is stable—e.g., at least a portion of the duration that the data pulse is at the high level or at the low level—defines a data valid window $T_{DVW}$. A data valid window $T_{DVW}$ is a time period or duration over which a given data pulse occurs during which a sampling circuit is to detect a sampling transition of the clock signal in order to avoid a setup violation and a hold violation. If the sampling transition occurs before the start of the data valid window $T_{DVW}$, then a setup violation occurs—either because the sampling transition occurred before the starting transition of the data pulse, or because the sampling transition occurred too close to after the starting transition that the actual amount of time that the level of the data pulse is stable before occurrence of the sampling transition is less than the setup time tDS. In addition, if the sampling transition occurs after the end of the data valid window $T_{DVW}$, then a hold violation occurs—either because the sampling transition occurred after the ending transition of the data pulse or occurred too close to before the ending transition that the actual amount of time that the level of the data pulse is stable after occurrence of the sampling transition is less than the hold time tDH.

Ideally, the sampling circuit 404 receives the clock signal CLK and the input data signal DIN relative to each other such that the sampling circuit 404 reliably or accurately samples the level of each data pulse in order to correctly identify the data value that each data pulse represents. Configuring the sampling circuit 404 to sample each data pulse in the middle or at a middle point of the duration of each pulse may maximize the chances of this ideal situation occurring. The ideal time at which to sample a data pulse is referred to as a target sampling time of the data pulse. Ideally, the sampling circuit 404 identifies sampling transitions in the middle of the durations of the data pulses and/or at the target sampling times of the data pulses. Accordingly, a given sampling transition is in a target sampling position when the sampling transition occurs at the target sampling time of its associated data pulse.

Figure 5C:
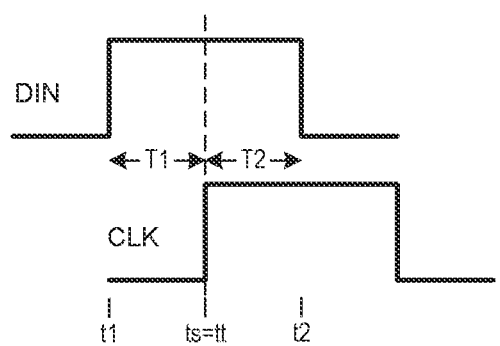
FIG. 5C is a timing diagram of a sampling transition of a clock signal in a target sampling position.

FIG. 5C shows a data pulse of the input data signal DIN and a pulse of the clock signal CLK, illustrating the ideal case where a sampling transition of the clock pulse is in the target sampling position. In FIG. 5C, a starting transition of the data pulse occurs at a first time t1, and an ending transition of the data pulse occurs at a second time t2. A target sampling time tt of the data pulse occurs in the middle between the first time t1 and the second time t2. Accordingly, a first time period T1 extending from the first time t1 to the target sampling time tt is the same as or equal to a second time period T2 extending from the target sampling time tt to the second time t2. Additionally, the sampling transition associated with the data pulse is the rising transition of the clock pulse. The sampling transition occurs at a sampling time ts. In FIG. 5B, for the ideal case, the sampling transition occurs at the target sampling time—i.e., the sampling time ts and the target sampling time tt are the same.

In actuality, when the transmitting circuit 102 sends the data signals DQ and the clock signal CLK to the receiving circuit 104, the sampling circuitry of the receiving circuit 104 may not receive the clock pulses in their respective target sampling positions. For a given sampling circuit that samples data pulses of an input data signal in response to sampling transitions of a clock signal, where the sampling transitions occur at times different than the target sampling times tt, the input data signal and the clock signal have skew between them. In general, as used herein, skew between a clock signal and a data signal is a deviation of a sampling transition of the clock signal from a target sampling position to sample a data pulse of the data signal. In addition, with respect to sampling times, skew between a clock signal and a data signal is a deviation of a sampling time ts from a target sampling time tt to sample a data pulse of a data signal. For a given pair of clock and data signals, where the clock signal performs sampling transitions at sampling times ts that match or occur at the same times as the target sampling times tt, the clock and data signals do not have skew between them. Alternatively, where the clock signal performs sampling transitions at sampling times ts different than the target sampling times tt (i.e., before or after the target sampling times tt), the clock and data signals have skew between them. An amount of skew (or skew amount) may be quantified by the difference in time between the sampling time ts and the target sampling time tt.

Figure 6A:
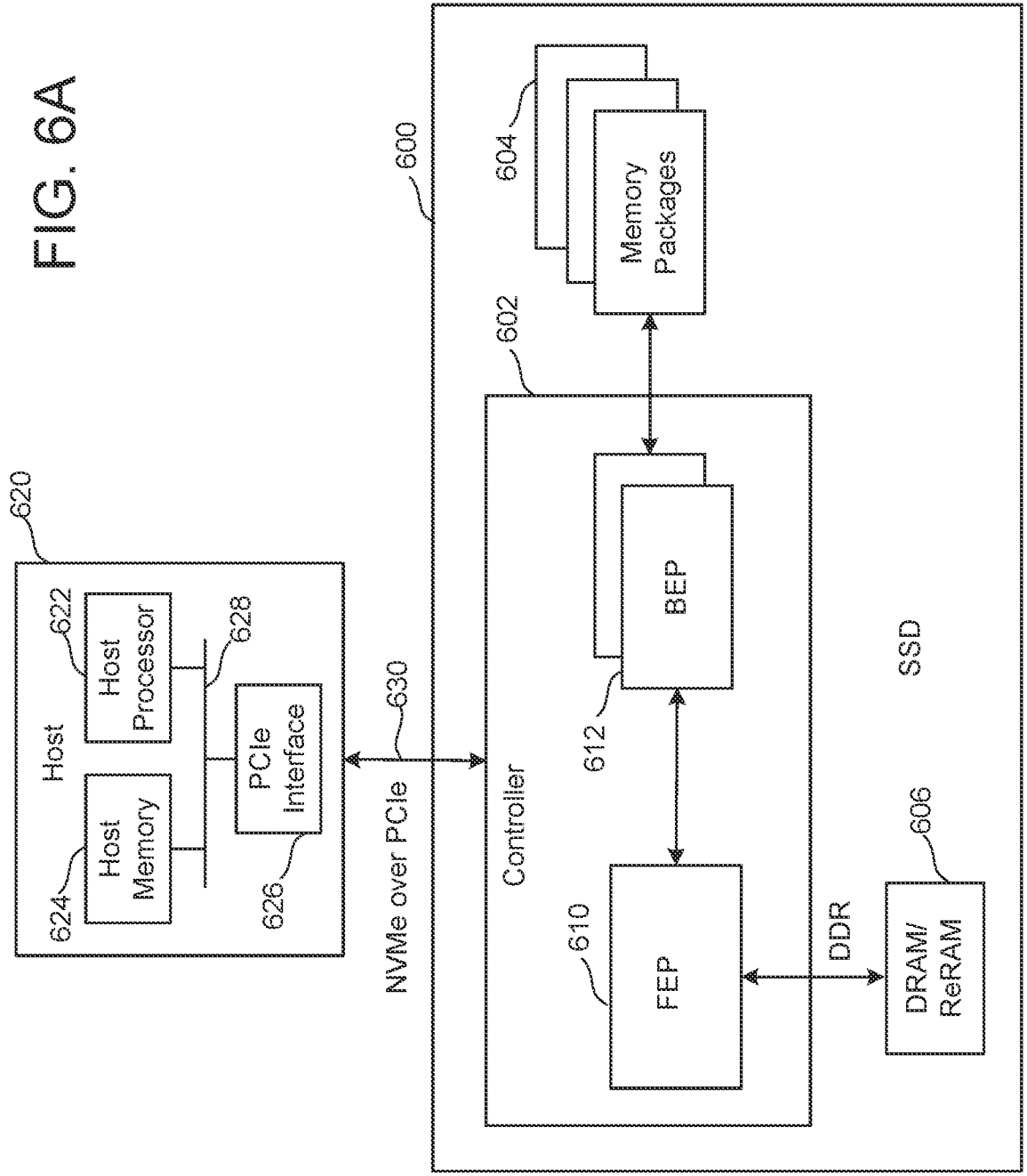
FIG. 6A is a block diagram of one embodiment of a storage device connected to a host.

Embodiments of semi-receiver side write training in non-volatile memory systems are disclosed herein. FIGS. 6A, 6B, 7, 8, 9A and 9B depict an example memory system in which embodiments may be practiced. FIG. 6A is a block diagram of one embodiment of a memory system 600 connected to a host system 620. Memory system 600 can implement the technology proposed herein. Many different types of storage devices can be used with the technology proposed herein. One example storage device is a solid state device (SSD); however, other types of storage devices can also be used. Memory system 600 comprises a memory controller 602, non-volatile memory 604 for storing data, and local memory (e.g. DRAM/ReRAM) 606. In some embodiments, the memory controller 602 includes the transmitting circuit 102 and the memory packages 604 contain the receiving circuits 104. Hence, the memory controller 602 may contain the delay controller 120. The memory packages 604 may contain data receivers 130 and data comparison logic 140. In some embodiments, the memory controller 602 includes a control circuit that is configured to perform transmitter side functionality during an embodiment of semi receiver side write training.

Memory controller 602 comprises a Front End Processor Circuit (FEP) 610 and one or more Back End Processor Circuits (BEP) 612. In one embodiment, FEP 610 circuit is implemented on an ASIC. In one embodiment, each BEP circuit 612 is implemented on a separate ASIC. The ASICs for each of the BEP circuits 612 and the FEP circuit 610 are implemented on the same semiconductor such that the Controller 602 is manufactured as a System on a Chip (SoC). FEP 610 and BEP 612 both include their own processors. In one embodiment, FEP 610 and BEP 612 work as a master slave configuration where the FEP 610 is the master and each BEP 612 is a slave. For example, FEP circuit 610 implements a flash translation layer that performs memory management (e.g., garbage collection, wear leveling, etc.), logical to physical address translation, communication with the host, management of DRAM (local volatile memory) and management of the overall operation of the SSD (or other non-volatile storage device). The BEP circuit 612 manages memory operations in the memory packages/die at the request of FEP circuit 110. For example, the BEP circuit 612 can carry out the read, erase and programming processes. Additionally, the BEP circuit 612 can perform buffer management, set specific voltage levels required by the FEP circuit 610, perform error correction, control the Toggle Mode interfaces to the memory packages, etc. In one embodiment, each BEP circuit 612 is responsible for its own set of memory packages. Memory controller 602 is one example of a control circuit.

In one embodiment, non-volatile memory 604 comprises a plurality of memory packages. Each memory package includes one or more memory die. Therefore, memory controller 602 is connected to one or more non-volatile memory die. In one embodiment, each memory die in the memory packages 604 utilize NAND flash memory (including two dimensional NAND flash memory and/or three dimensional NAND flash memory). In other embodiments, the memory package can include other types of memory.

In some embodiments, controller 602 communicates with host system 620 via an interface 630 that implements NVM Express (NVMe) over PCI Express (PCIe). For working with memory system 600, host system 620 includes a host processor 622, host memory 624, and a PCIe interface 626 connected to bus 628. Host memory 624 is the host's physical memory, and can be DRAM, SRAM, non-volatile memory or another type of storage. Host system 620 is external to and separate from memory system 600. In one embodiment, memory system 600 is embedded in host system 620. Any combination of one or more of memory system 600, and/or memory system 600 in combination with host system 620 may be referred to herein as an apparatus. In operation, when the host system 620 needs to read data from or write data to the non-volatile memory 604, it will communicate with the memory controller 602. If the host system 620 provides a logical address to which data is to be read/written, the controller can convert the logical address received from the host to a physical address in the non-volatile memory 604.

FIG. 6B is a block diagram of one embodiment of FEP circuit 610. FIG. 6B shows a PCIe interface 650 to communicate with host system 620 and a host processor 652 in communication with that PCIe interface. The host processor 652 can be any type of processor known in the art that is suitable for the implementation. Host processor 652 is in communication with a network-on-chip (NOC) 654. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 654 is the memory processor 656, SRAM 660 and a DRAM controller 662. The DRAM controller 662 is used to operate and communicate with the DRAM (e.g., DRAM 606). SRAM 660 is local RAM memory used by memory processor 656. Memory processor 656 is used to run the FEP circuit and perform the various memory operations. Also in communication with the NOC are two PCIe Interfaces 664 and 666. In the embodiment of FIG. 6B, the SSD controller will include two BEP circuits 612; therefore there are two PCIe Interfaces 664/666. Each PCIe Interface communicates with one of the BEP circuits 612. In other embodiments, there can be more or less than two BEP circuits 612; therefore, there can be more than two PCIe Interfaces.

Figure 7:
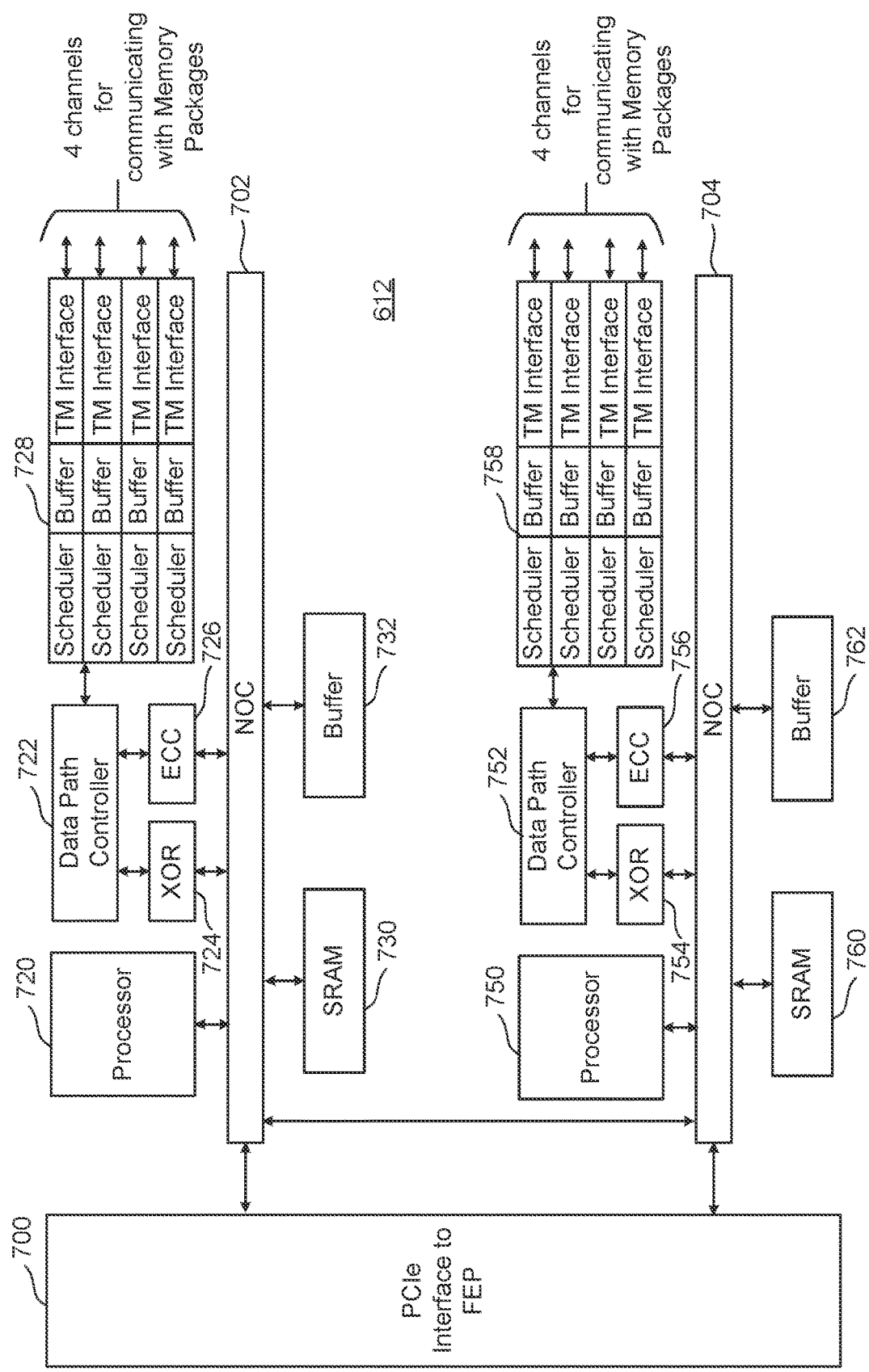
FIG. 7 is a block diagram of one embodiment of a Back End Processor Circuit. In some embodiments, the Back End Processor Circuit is part of a Controller.

FIG. 7 is a block diagram of one embodiment of the BEP circuit 612. FIG. 7 shows a PCIe Interface 700 for communicating with the FEP circuit 610 (e.g., communicating with one of PCIe Interfaces 664 and 666 of FIG. 6B). PCIe Interface 700 is in communication with two NOCs (Network-on-a-Chip) 702 and 704. In one embodiment, the two NOCs can be combined to one large NOC. Each NOC (702/704) is connected to SRAM (730/760), a buffer (732/762), processor (720/750), and a data path controller (722/752) via an XOR engine (724/754) and an ECC engine (726/756). The ECC engines 726/756 are used to perform error correction, as known in the art. The XOR engines 724/754 are used to XOR the data so that data can be combined and stored in a manner that can be recovered in case there is a UECC failure. In an embodiment, XOR engines 724/754 form a bitwise XOR of different pages of data. The XOR result may be stored in a memory package 604. In the event that an ECC engine 726/756 is unable to successfully correct all errors in a page of data that is read back from a memory package 604, the stored XOR result may be accessed from the memory package 604. The page of data may then be recovered based on the stored XOR result, along with the other pages of data that were used to form the XOR result.

Data path controller 722 is connected to an interface module for communicating via four channels with memory packages. Thus, the top NOC 702 is associated with an interface 728 for four channels for communicating with memory packages and the bottom NOC 704 is associated with an interface 758 for four additional channels for communicating with memory packages. Each interface 728/758 includes four Toggle Mode interfaces (TM Interface), four buffers and four schedulers. There is one scheduler, buffer and TM Interface for each of the channels. The processor can be any standard processor known in the art. The data path controllers 722/752 can be a processor, FPGA, microprocessor or other type of controller. The XOR engines 724/754 and ECC engines 726/756 are dedicated hardware circuits, known as hardware accelerators. In other embodiments, the XOR engines 724/754 and ECC engines 726/756 can be implemented in software. The scheduler, buffer, and TM Interfaces are hardware circuits.

Interfaces 728/758, alone or in combination, may be referred to as a memory interface configured to be connected to non-volatile memory (e.g., memory package 604). A combination of one or more of processor 720/750, data path controller 722/752, XOR 724/754, ECC 726/756 may be referred to herein as a processor circuit. The buffer 732/762, SRAM 730/760, and/or NOCs 702/704 may also be considered to be a part of the processor circuit.

Figure 8:
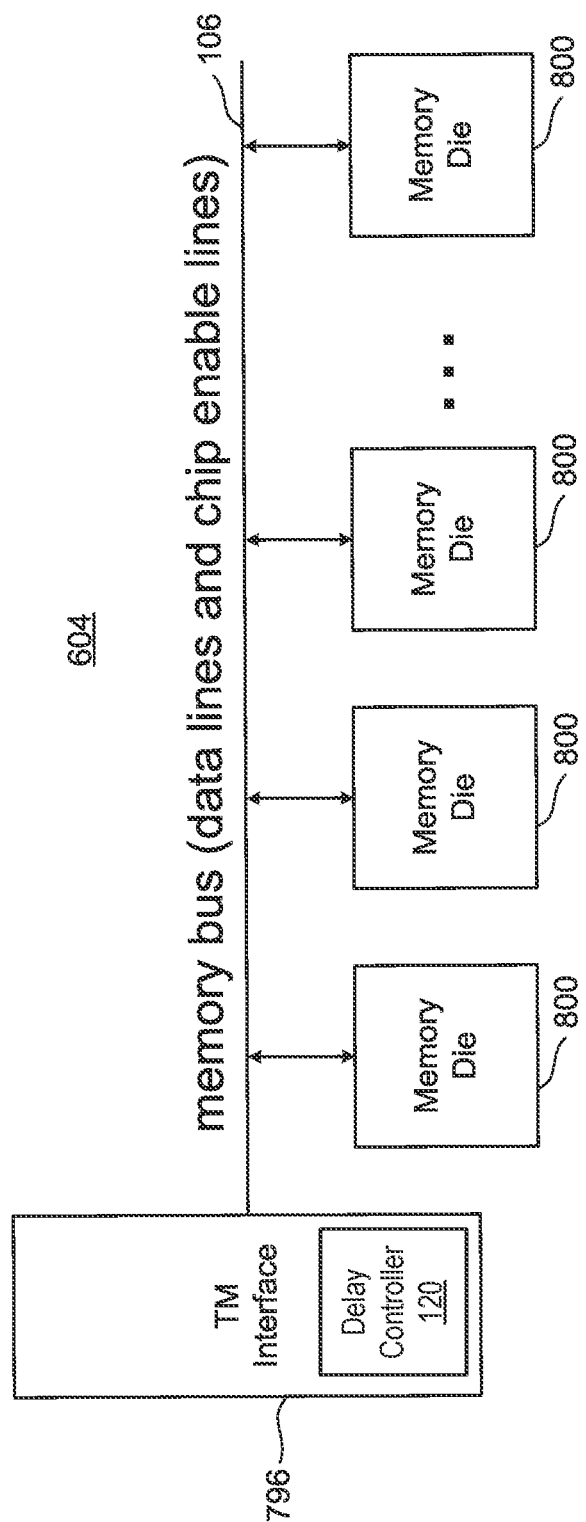
FIG. 8 is a block diagram of one embodiment of a memory package.

FIG. 8 is a block diagram of one embodiment of a memory package 604 that includes a plurality of memory die 800 connected to a memory bus (data lines and chip enable lines) 106. The memory bus 106 connects to a Toggle Mode Interface 796 for communicating with the TM Interface of a BEP circuit 612 (see e.g., FIG. 7). In some embodiments, the memory package can include a small controller connected to the memory bus and the TM Interface. The memory package can have one or more memory die. In one embodiment, each memory package includes eight or 16 memory dies; however, other numbers of memory dies can also be implemented. The technology described herein is not limited to any particular number of memory dies. In some embodiments, each memory die 800 is a receiving circuit 104 that contains data receivers 130 and data comparison logic 140. In some embodiments, write training is performed in parallel on all of the memory dies 800, which provides for fast write training. In some embodiments, the TM interface 796 contains the delay controller 120. However, some of all of the delay controller 120 could be located in a different part of the memory controller 602.

Figure 9A:
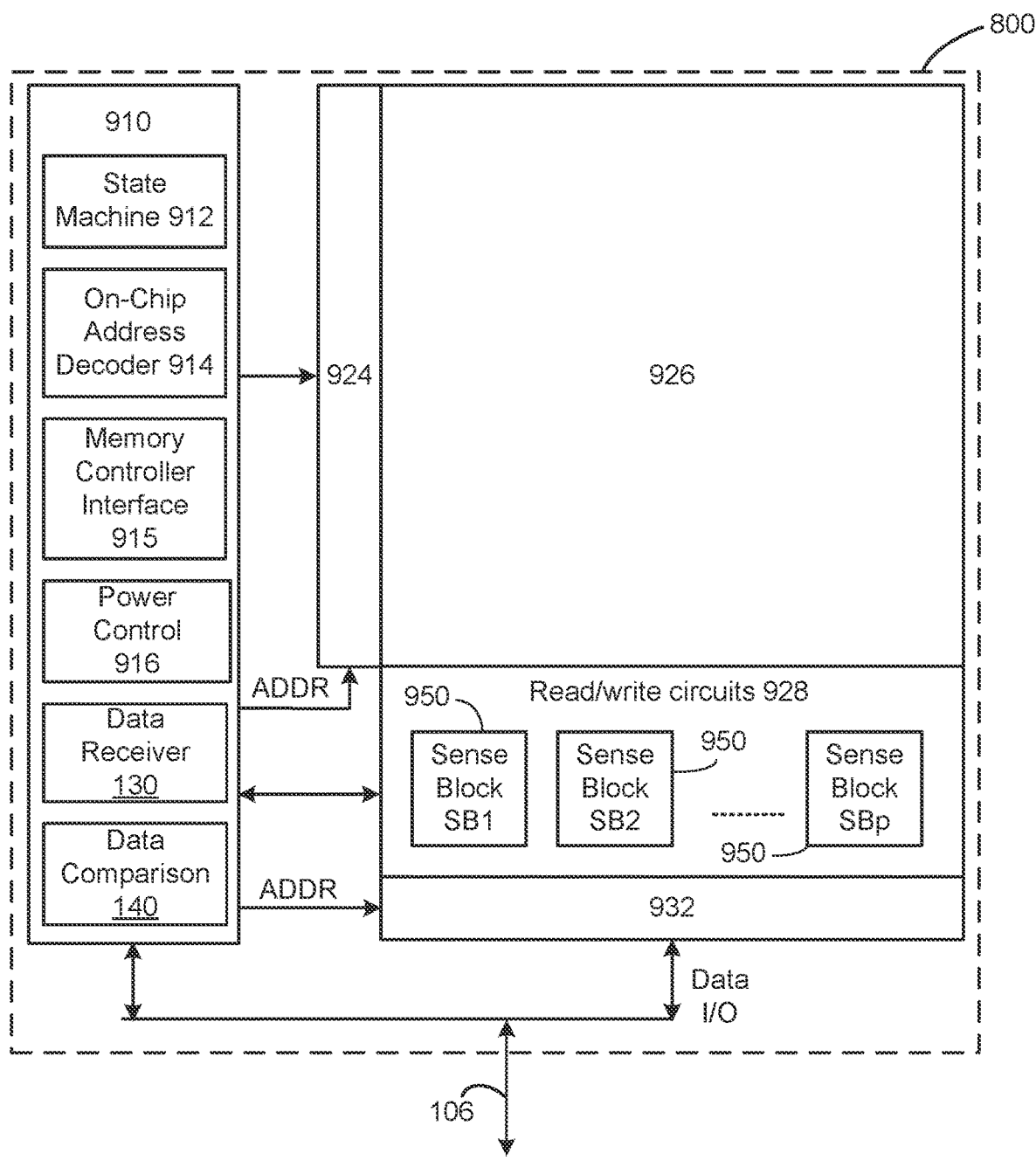
FIG. 9A is a block diagram of one embodiment of a memory die.

FIG. 9A is a functional block diagram of one embodiment of a memory die 800. Each of the one or more memory die 800 of FIG. 8 can be implemented as memory die 800 of FIG. 9A. The components depicted in FIG. 9A are electrical circuits. In one embodiment, each memory die 800 includes a memory structure 926, control circuitry 910, and read/write circuits 928, all of which are electrical circuits. Memory structure 926 is addressable by word lines via a row decoder 924 and by bit lines via a column decoder 932. The read/write circuits 928 include multiple sense blocks 950 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller 602 and the memory die 800 via memory controller interface 915. The memory controller interface 915 may also be referred to herein as a communication interface. Examples of memory controller interface 915 include a Toggle Mode Interface and an Open NAND Flash Interface (ONFI). Other I/O interfaces can also be used.

Control circuitry 910 cooperates with the read/write circuits 928 to perform memory operations (e.g., write, read, erase, and others) on memory structure 926. In one embodiment, control circuitry 910 includes a state machine 912, an on-chip address decoder 914, a power control module 916, and a memory controller interface 915. State machine 912 provides die-level control of memory operations. In one embodiment, state machine 912 is programmable by software. In other embodiments, state machine 912 does not use software and is completely implemented in hardware (e.g., electrical circuits). In some embodiments, state machine 912 can be replaced by a microcontroller or microprocessor. In one embodiment, control circuitry 910 includes buffers such as registers, ROM fuses and other storage devices for storing default values such as base voltages and other parameters. The default values and other parameters could be stored in a region of the memory structure 926.

The on-chip address decoder 914 provides an address interface between addresses used by controller 602 to the hardware address used by the decoders 924 and 932. Power control module 916 controls the power and voltages supplied to the word lines and bit lines during memory operations. Power control module 916 may include charge pumps for creating voltages.

Memory controller interface 915 is an electrical interface for communicating with memory controller 602. For example, memory controller interface 915 may implement a Toggle Mode Interface that connects to the Toggle Mode interfaces of memory interface 228/258 for memory controller 602. In one embodiment, memory controller interface 915 includes a set of input and/or output (I/O) pins that connect to communication channel 106 (also refers to herein as a data bus). In one embodiment, communication channel 106 connects to the memory controller 602 as part of the Toggle Mode Interface. The data receiver 130 and data compare logic 140 have been discussed above.

For purposes of this document, control circuitry 910, alone or in combination with read/write circuits 928 and decoders 924/932, comprise a control circuit configured to be connected to memory structure 926. This control circuit is an electrical circuit that performs at least some of the functions described below in the flow charts (such as receiver side functions of semi receiver side write training). In some embodiments, the control circuitry 910 and memory controller 602 together perform the functions described below in the flow charts. For example, control circuitry 910 may implement receiver side functions of semi receiver side write training, with the memory controller 602 implementing transmitter side functions of semi receiver side write training.

In one embodiment, memory structure 926 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 926 comprise vertical NAND strings with charge-trapping material such as described, for example, in U.S. Pat. No. 9,721,662, incorporated herein by reference in its entirety. In another embodiment, memory structure 926 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 926 is not limited to the examples above. Many different types of memory array architectures or memory cell technologies can be used to form memory structure 926. No particular non-volatile memory technology is required for purposes of the new claimed embodiments proposed herein. Other examples of suitable technologies for memory cells of the memory structure 926 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 926 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A storage device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a $Ge_2Sb_2Te_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 9B:
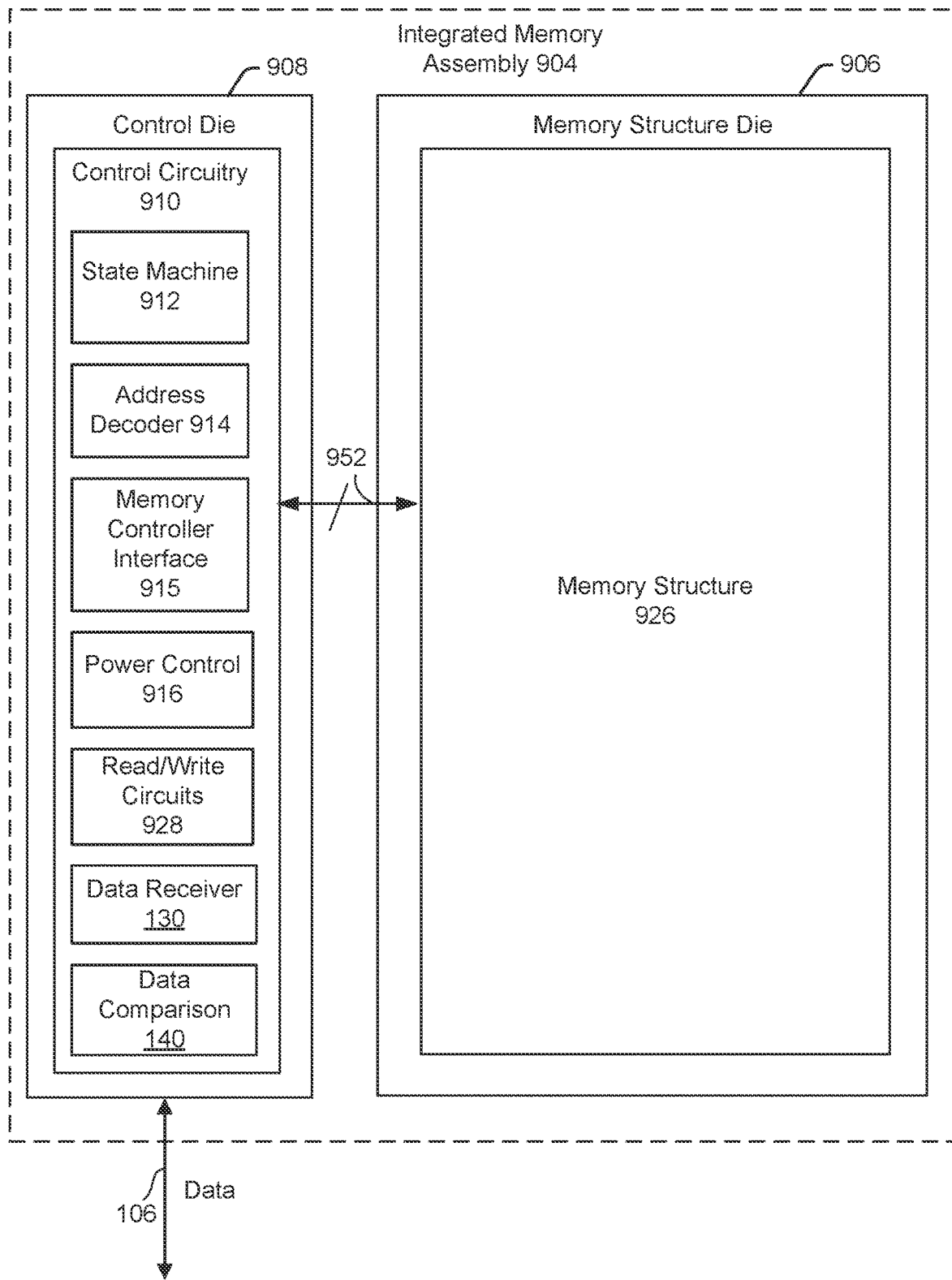
FIG. 9B depicts a functional block diagram of one embodiment of an integrated memory assembly.

FIG. 9B depicts a functional block diagram of one embodiment of an integrated memory assembly 904. The integrated memory assembly 904 may be used in a memory package 604 in memory system 600. In one embodiment, the integrated memory assembly 904 includes two types of semiconductor die (or more succinctly, "die"). Memory structure die 906 includes include memory structure 926. Memory structure 926 may contain non-volatile memory cells. Control die 908 includes control circuitry 910. In some embodiments, the memory structure die 906 and the control die 908 are bonded together. The control circuitry includes state machine 912, an address decoder 914, a power control circuit 916, memory controller interface 915, data receiver 130, and data comparison logic 140. The control circuitry also includes read/write circuits 928. In another embodiment, a portion of the read/write circuits 928 are located on control die 908, and a portion of the read/write circuits 928 are located on memory structure die 906.

Any subset of components in the control circuitry 910 can be considered a control circuit. The control circuit can include hardware only or a combination of hardware and software (including firmware). For example, a controller programmed by firmware is one example of a control circuit. The control circuit can include a processor, PGA (Programmable Gate Array, FPGA (Field Programmable Gate Array), ASIC (Application Specific Integrated Circuit), integrated circuit or other type of circuit.

Pathways 952 are pathways between one or more components in the control circuitry 910 and the memory structure on memory structure die 906. A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal.

In one embodiment, integrated memory assembly 904 includes a set of input and/or output (I/O) pins that connect to communication channel 106 (also refers to herein as a data bus). In one embodiment, communication channel 106 connects the memory controller 602 directly to control die 908.

Figure 10:
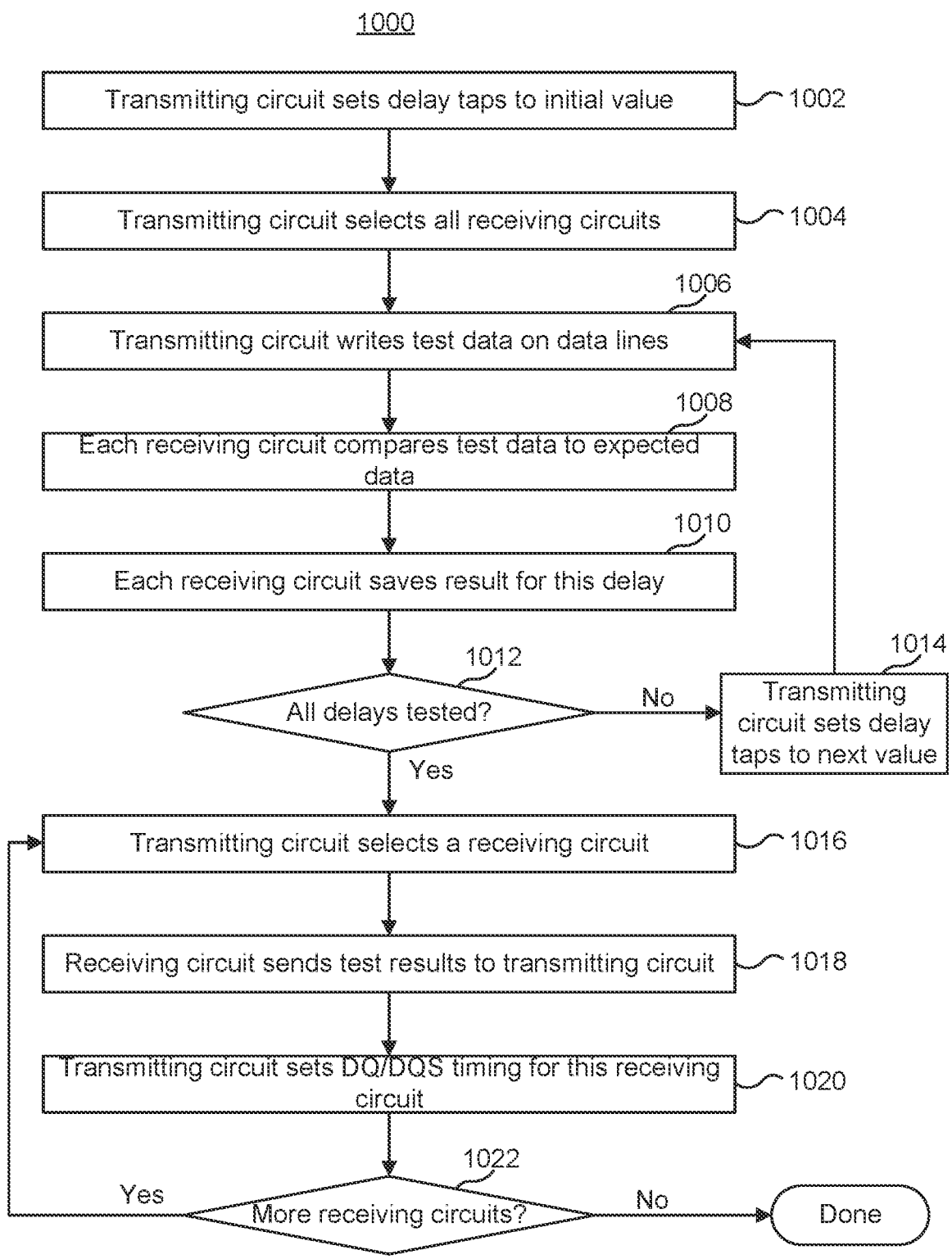
FIG. 10 is a flowchart of one embodiment of a process of semi-receiver side write training in a non-volatile memory system.

FIG. 10 is a flowchart of one embodiment of a process 1000 of semi receiver side write training in a non-volatile memory system. In one embodiment, the process 1000 is performed by the transmitting circuit 102 and the receiving circuit 104 of FIG. 1. In one embodiment, the transmitting circuit 102 is included in memory controller (e.g., controller 602). In one embodiment, the receiving circuit 104 resides on a memory die 800. In one embodiment, the receiving circuit 104 resides on a control die 908, which is configured to be connected to a memory structure die 906.

Step 1002 includes the transmitting circuit 102 setting the delay taps to an initial value. In one embodiment, the data delay control circuit 320 in the delay controller 120 issues delay signals DC_DQ(1)-DC_DQ(N) to the respective configurable data delay circuits 302(1)-302(N) in order to set the delay taps.

Figure 11A:
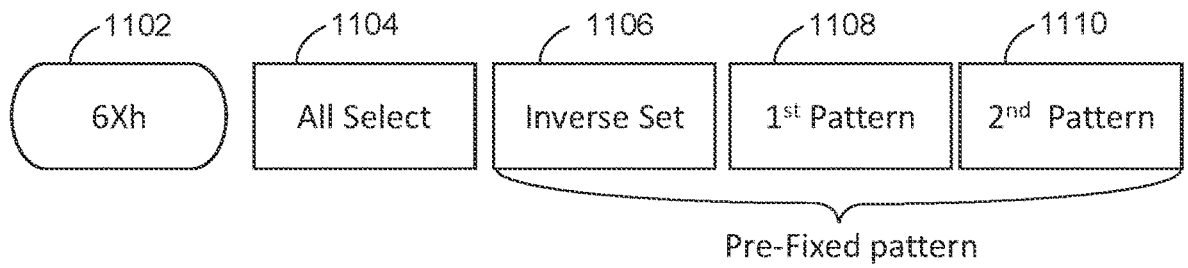
FIG. 11A depicts an example of information the transmitting circuit may send over the data lines to implement steps 1004 and 1006 of the process of FIG. 10.

Step 1004 includes the transmitting circuit 102 selecting all receiving circuits 104(1)-104(p). Step 1004 may also include the transmitting circuit 102 providing a test pattern to the receiving circuits 104. FIG. 11A depicts an example of information the transmitting circuit 102 may send over the data lines 108 to implement steps 1004 and 1006. Hence, the information in FIG. 11A may be sent on data lines 108(1)-108(N). The transmitting circuit 102 may issue a semi receiver side writing training command 1102. The example command 1102 is "6X" in hexadecimal format. The "X" refers to an integer. The "All Select Command" 1104 selects all of the receiving circuits 104. In an embodiment, the All Select Command 1104 selects all Logical Unit Numbers (LUNs). In an embodiment, the LUNs refer to the different memory die 800. In an embodiment, the LUNs refer to the different memory structure die 906. In an embodiment, the LUNs refer to the different control die 908. The inverse set 1106, 1$^{st}$ pattern 1108, and 2$^{nd}$ pattern 1110 are used to provide a pre-fixed pattern.

Figure 11B:
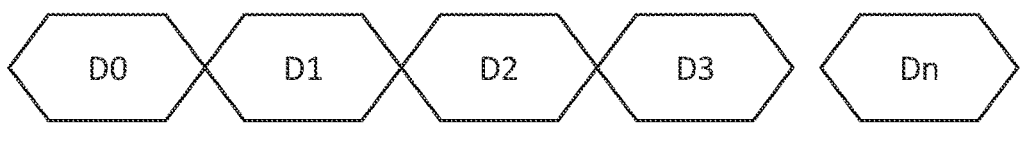
FIGS. 11B and 11C show examples of writing test data on the data lines during an embodiment of semi receiver side write training.

Step 1006 includes the transmitting circuit 102 writing test data on the data lines 108. FIG. 11B shows an example of writing test data on the data lines. In an embodiment, the test data 1120 includes n+1 bits of test data for each data line 108. The notation of "Address #0" indicates that this is for the initial delay value.

Step 1008 includes each receiving circuit 104 comparing the test data to expected data. With reference to FIG. 4, the data compare logic 140 compares the data received by the sampling circuit 404 with the pre-fixed patterns 410. The pre-fixed patterns 410 are based on the pre-fixed pattern in FIG. 11A. The data compare logic 140 determines whether this a pass or a fail for this delay value. In one embodiment, all of the test data must match the expected values for a pass.

Step 1010 includes each receiving circuit 104 saving a result for this delay. With respect to FIG. 4, the result is stored in the address register 416. In one embodiment, a pass or fail result is stored for each delay (or for each address). Moreover, a pass/fail result may be stored for each data line 108.

Figure 11C:
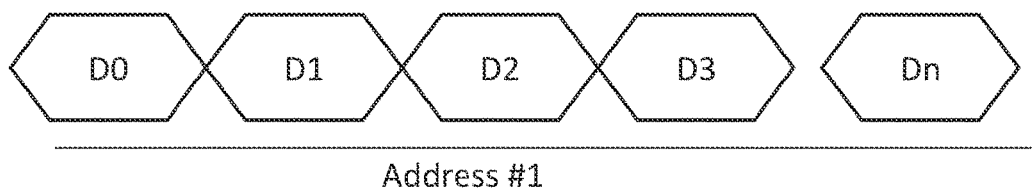

Step 1012 is a determination of whether all delays have been tested. If not, then in step 1014 the transmitting circuit 102 sets the delay taps 302 to the next value. In one embodiment, the data delay control circuit 320 in the delay controller 120 issues new delay signals DC_DQ(1)-DC_DQ(N) to the respective configurable data delay circuits 302(1)-302(N). Then steps 1006-1012 are repeated. FIG. 11C depicts test data 1130 again being sent on the data lines 108 after a "DQS timing change". However, the address is now "address #1", which indicates that the next delay value is being used. Each receiving circuit 104 may store a pass/fail result for this delay (for each data line 108). After all delays have been tested (step 1012 is yes), step 1016 is performed.

Figure 11D:
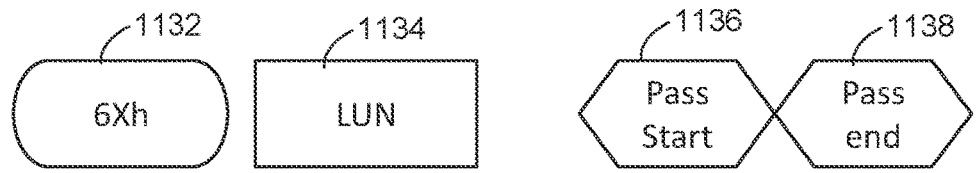
FIG. 11D shows an example of information that may be exchanged on the data lines in steps 1016 and 1018 of the process of FIG. 10.

Step 1016 includes the transmitting circuit 102 selecting a receiving circuit 104. Step 1018 includes the selected receiving circuit 104 sending test results to the transmitting circuit 102. FIG. 11D shows an example of information that may be exchanged on the data lines 108 in steps 1016 and 1018. The transmitting circuit 102 issues a provide semi-receiver side write training results command 1132. The command 1132 is "6X" hexadecimal in this example, where "X" is an integer. The transmitting circuit 102 selects one of the receiving circuits 104 by specifying the LUN 1134. The selected receiving circuit 104 sends test results by sending the pass start 1136 and the pass end 1138. Referring back to FIG. 2, it is expected that normally there will be some fails, followed by a number of passes, and then some more fails. Hence, there is a pass start 230a and a pass end 230b.

Step 1020 includes the transmitting circuit setting DQ/DQS timing for this receiving circuit 104. In one embodiment, the transmitting circuit 102 stores delay values in the delay value storage 330. When the transmitting circuit 102 sends normal data to the receiving circuit 104 these delay values are used in the configurable data delay circuits 302(1)-302(N). The normal data refers to, for example, user data to be written to the memory structure 926 as part of a program command.

Step 1022 includes a determination of whether there are more receiving circuits 104 for which the test results are needed. If so, steps 1016-1020 are repeated. In this manner each receiving circuit 104 is able to report its test results to the transmitting circuit 102. Moreover, the transmitting circuit 102 may store separate delay values for each receiving circuit 104 in the delay value storage 330.

Figure 12:
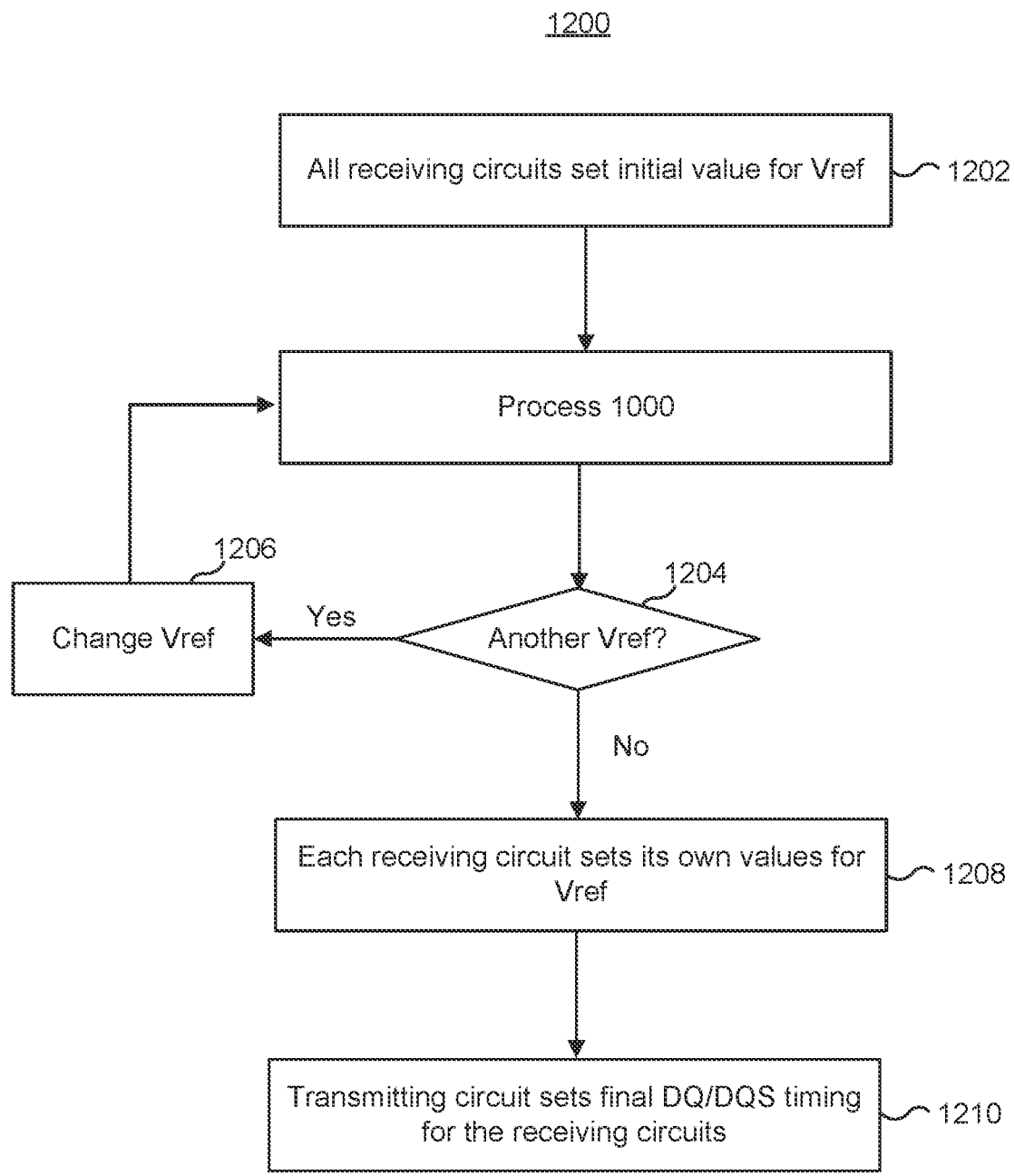
FIG. 12 is a flowchart of one embodiment of a process for calibrating reference voltages for data buffers in semi-receiver side write training.

In some embodiments, a reference voltage for the data buffers 402 is calibrated as a part of the overall semi-receiver side write training. FIG. 12 is a flowchart of one embodiment of a process 1200 for calibrating reference voltages for data buffers 402 in semi-receiver side write training. There are many ways in which the reference voltages for the data buffers 402 may be calibrated. Hence, many variations of process 1200 are possible.

Step 1202 includes all receiving circuits 104 setting an initial value for the reference voltage (Vref) for the data buffers 402. Next, process 1000 is performed. Recall that process 1000 is an embodiment of semi receiver side write training. Hence, process 1000 is performed with this initial value for Vref. After performing process 1000, a determination is made in step 1204 whether this is an additional Vref to test. If so, the value for Vref is changed in step 1206. Then, process 1000 is performed again with this value of Vref for the data buffers 402. After all value for Vref have been tested, step 1208 is performed.

Step 1208 includes each receiving circuit 104 setting its own value(s) for Vref. In one embodiment, a single value is used for all of the data buffers 402. In one embodiment, different values of Vref can be used for different data buffers 402 on a receiving circuit 104. Recall that in step 1018 of process 1000, the receiving circuit 104 reports the test results to the transmitting circuit 102. Recall that the test results may include the shortest delay for which data was validly received and the longest delay for which date is validly received. These passing delay values may be different for the different values of Vref. Hence, the receiving circuit 104 may inform the transmitting circuit 102 of the passing delay values for the Vref that is selected in step 1208.

Step 1210 includes the transmitting circuit 102 setting final DQ/DQS timings for the receiving circuits 104. These final DQ/DQS timing may therefore take into account the Vref that was established for each receiving circuit 104 in step 1208.

In view of the foregoing, it can be seen that a first embodiment includes, an apparatus comprising a first semiconductor die comprising a first control circuit configured to connect to a memory structure comprising non-volatile memory cells. The apparatus comprises a communication bus comprising a plurality of data lines and a data strobe line. The apparatus comprises a second semiconductor die connected to the first semiconductor die by the communication bus. The second semiconductor die comprises a second control circuit configured to scan a data strobe signal through a set of delays while sending test data on the data lines to the first semiconductor die. The first control circuit is configured to: determine, for each of the data lines, passing delay values for which the test data is validly received; and report the passing delay values for each of the data lines to the second control circuit. The second control circuit is configured to control the delay between the data strobe signal sent on the data strobe line and user data sent on each of the data lines based on the passing delay values for each of the data lines.

In a second embodiment and in furtherance to the first embodiment, the second semiconductor die comprises a delay tap for each of the data lines. Each delay tap is configured to provide a configurable delay between the data strobe signal and user data sent on the respective data line.

In a third embodiment and in furtherance to the first or second embodiments, the first control circuit is configured to: compare the test data for each delay value to expected data to determine whether the test data is validly received; determine, for each of the data lines, a shortest delay for which the test data is validly received and a longest delay for which the test data is validly received; and report the shortest delay and the longest delay to the second control circuit.

In a fourth embodiment and in furtherance to the third embodiment, the second control circuit is configured to set the delay value for each of the data lines for the first semiconductor die based on the shortest delay and the longest delay for the respective data line.

In a fifth embodiment and in furtherance to any of the first to fourth embodiments, the apparatus further comprises additional semiconductor dies each comprising a first control circuit configured to connect to a memory structure comprising non-volatile memory cells. The second semiconductor die is connected to the additional semiconductor dies by the communication bus. The first semiconductor die and the additional semiconductor dies are a plurality of dies. The second control circuit on the second semiconductor die is configured to: select the plurality of dies for write training in parallel; and scan through the set of delays while sending the test data on the data lines to the plurality of dies.

In a sixth embodiment and in furtherance to any of the fifth embodiment, the first control circuit of each of the additional semiconductor dies is configured to determine, for each data line, a shortest delay for which the test data is valid and a longest delay for which the test data is valid.

In a seventh embodiment and in furtherance to any of the sixth embodiment, the second control circuit on the second semiconductor die is configured to: individually select respective additional dies; and control the delay between the data strobe signal sent on the data strobe line and user data sent on each of the data lines to the individually selected additional dies based on the passing delay values for each of the data lines for the selected additional die.

In an eighth embodiment and in furtherance to any of the first to seventh embodiments, the memory structure resides on the first semiconductor die.

In a ninth embodiment and in furtherance to any of the first to eighth embodiments, the apparatus further comprises a memory structure die that comprises the non-volatile memory cells. The first semiconductor die is bonded to the memory structure die.

In a tenth embodiment and in furtherance to any of the first to ninth embodiments, the memory structure comprises a three-dimensional array of NAND memory cells.

In an eleventh embodiment and in furtherance to any of the first to tenth embodiments, the second control circuit on the second semiconductor die is a memory controller that is substantially compliant with the Open NAND Flash Interface (ONFI) specification.

One embodiment includes a method of write training in a non-volatile memory system. The method comprises: a) setting delay taps on a memory controller to initial values, wherein the delay taps control a delay between a data strobe signal and data signals sent on a communication bus between the memory controller and a plurality of semiconductor dies, each semiconductor die comprising a control circuit configured to connect to non-volatile memory cells; b) sending the data strobe signal and test data on the communication bus from the memory controller to the plurality of semiconductor dies while the delay taps have the initial values; c) determining, by the control circuit on each respective semiconductor die, data eye information for each data signal; d) repeating said a) through said c) for other delay tap values; e) reporting the data eye information from each respective semiconductor die to the memory controller; and f) sending user data from the memory controller to each respective semiconductor die over the communication bus at different times, including setting the delay taps on the memory controller for each data line based on the data eye information for the respective semiconductor die when sending the user data to the respective semiconductor die.

One embodiment includes a non-volatile memory system, comprising a plurality of semiconductor dies, a communication bus comprising a plurality of data lines and a data strobe line, and a memory controller die communicatively coupled to the plurality of semiconductor dies via the plurality of data lines and the data strobe line. Each semiconductor die comprises a control circuit configured to connect to a three-dimensional memory array of non-volatile memory cells. The memory controller die comprises a delay tap for each data line. Each delay tap is configured to provide a configurable delay between the data strobe signal and a data signal associated with the delay tap. The memory controller die is configured to provide a data strobe signal on the data strobe line when providing data signals on the corresponding plurality of data lines. The memory controller die is configured to select the plurality of semiconductor dies for write training. The write training includes the memory controller die scanning through a plurality of different values for the delay taps while sending test data on the plurality of data lines to the plurality of semiconductor dies. The control circuit of each semiconductor die is configured to determine whether the test data is validly received for each data line for each of the delays. The control circuit of each semiconductor die is configured to inform the memory controller die of the shortest delay for which data is validly received for each data line and the longest delay for which data is validly received for each data line. The memory controller die is configured to set the delay taps for each data line for each semiconductor die based on the shortest delay for which data is validly received for each data line and the longest delay for which data is validly received for each data line for the respective semiconductor die.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
    a first semiconductor die comprising a first control circuit configured to connect to a memory structure comprising non-volatile memory cells;
    a communication bus comprising a plurality of data lines and a data strobe line; and
    a second semiconductor die connected to the first semiconductor die by the communication bus, the second semiconductor die comprising a second control circuit configured to scan a data strobe signal through a set of delays while sending test data on the data lines to the first semiconductor die;
    wherein the first control circuit is configured to:
        determine, for each of the data lines, passing delay values for which the test data is validly received; and
        report the passing delay values for each of the data lines to the second control circuit; and
    wherein the second control circuit is configured to control the delay between the data strobe signal sent on the data strobe line and user data sent on each of the data lines based on the passing delay values for each of the data lines.

2. The apparatus of claim 1, wherein:
    the second semiconductor die comprises a delay tap for each of the data lines, wherein each delay tap is configured to provide a configurable delay between the data strobe signal and user data sent on the respective data line.

3. The apparatus of claim 1, wherein the first control circuit is configured to:
    compare the test data for each delay value to expected data to determine whether the test data is validly received;
    determine, for each of the data lines, a shortest delay for which the test data is validly received and a longest delay for which the test data is validly received; and
    report the shortest delay and the longest delay to the second control circuit.

4. The apparatus of claim 3, wherein the second control circuit is configured to:
    set the delay value for each of the data lines for the first semiconductor die based on the shortest delay and the longest delay for the respective data line.

5. The apparatus of claim 1, further comprising additional semiconductor dies each comprising a first control circuit configured to connect to a memory structure comprising non-volatile memory cells, the second semiconductor die connected to the additional semiconductor dies by the communication bus, wherein the first semiconductor die and the additional semiconductor dies are a plurality of dies;
    wherein the second control circuit on the second semiconductor die is configured to:
        select the plurality of dies for write training in parallel; and
        scan through the set of delays while sending the test data on the data lines to the plurality of dies.

6. The apparatus of claim 5, wherein:
    the first control circuit of each of the additional semiconductor dies is configured to determine, for each data line, a shortest delay for which the test data is valid and a longest delay for which the test data is valid.

7. The apparatus of claim 6, the second control circuit on the second semiconductor die is configured to:
    individually select respective additional dies; and
    control the delay between the data strobe signal sent on the data strobe line and user data sent on each of the data lines to the individually selected additional dies based on the passing delay values for each of the data lines for the selected additional die.

8. The apparatus of claim 1, wherein:
    the memory structure resides on the first semiconductor die.

9. The apparatus of claim 1, further comprising:
a memory structure die that comprises the non-volatile memory cells, wherein the first semiconductor die is bonded to the memory structure die.

10. The apparatus of claim 1, wherein the memory structure comprises a three-dimensional array of NAND memory cells.

11. The apparatus of claim 1, wherein the second control circuit on the second semiconductor die is a memory controller that is substantially compliant with the Open NAND Flash Interface (ONFI) specification.

12. A method of write training in a non-volatile memory system, the method comprising:
a) setting delay taps on a memory controller to initial values, wherein the delay taps control a delay between a data strobe signal and data signals sent on a communication bus between the memory controller and a plurality of semiconductor dies, each semiconductor die comprising a control circuit configured to connect to non-volatile memory cells;
b) sending the data strobe signal and test data on the communication bus from the memory controller to the plurality of semiconductor dies while the delay taps have the initial values;
c) determining, by the control circuit on each respective semiconductor die, data eye information for each data signal;
d) repeating said a) through said c) for other delay tap values;
e) reporting the data eye information from each respective semiconductor die to the memory controller; and
f) sending user data from the memory controller to each respective semiconductor die over the communication bus at different times, including setting the delay taps on the memory controller for each data line based on the data eye information for the respective semiconductor die when sending the user data to the respective semiconductor die.

13. The method of claim 12, wherein sending the data eye information from each respective semiconductor die to the memory controller comprises:
reporting a shortest delay between the data strobe signal and the data signal for each data signal on the communication bus for which data is validly received; and
reporting a longest delay between the data strobe signal and the data signal for each data signal on the communication bus for which data is validly received.

14. The method of claim 13, wherein:
reporting the shortest delay between the data strobe signal and the data signal for each data line for which data is validly received for a given semiconductor die comprises reporting a pass start address on the communication bus in response to a request from the memory controller; and
reporting the longest delay between the data strobe signal and the data signal for each data line for which data is validly received for a given semiconductor die comprises reporting a pass end address on the communication bus in response to the request from the memory controller.

15. The method of claim 12, further comprising:
issuing a write training command by the memory controller over the communication bus to the semiconductor dies; and
issuing on all select signal by the memory controller over the communication bus to select all of the semiconductor dies to take part in write training in response to the write training command.

16. A non-volatile memory system, comprising:
a plurality of semiconductor dies, each semiconductor die comprising a control circuit configured to connect to a three-dimensional memory array of non-volatile memory cells;
a communication bus comprising a plurality of data lines and a data strobe line; and
a memory controller die communicatively coupled to the plurality of semiconductor dies via the plurality of data lines and the data strobe line, wherein the memory controller die comprises a delay tap for each data line, wherein each delay tap is configured to provide a configurable delay between the data strobe signal and a data signal associated with the delay tap, wherein the memory controller die is configured to provide a data strobe signal on the data strobe line when providing data signals on the corresponding plurality of data lines, wherein the memory controller die is configured to select the plurality of semiconductor dies for write training, the write training including the memory controller die scanning through a plurality of different values for the delay taps while sending test data on the plurality of data lines to the plurality of semiconductor dies;
wherein the control circuit of each semiconductor die is configured to determine whether the test data is validly received for each data line for each of the delays, the control circuit of each semiconductor die is configured to inform the memory controller die of the shortest delay for which data is validly received for each data line and the longest delay for which data is validly received for each data line; and
wherein the memory controller die is configured to set the delay taps for each data line for each semiconductor die based on the shortest delay for which data is validly received for each data line and the longest delay for which data is validly received for each data line for the respective semiconductor die.

17. The non-volatile memory system of claim 16, wherein:
the memory controller die is configured to send user data to each respective semiconductor die with the delay taps set based on the write training; and
the control circuit of each respective semiconductor die is configured to store the user data in the non-volatile memory cells.

18. The non-volatile memory system of claim 16, wherein the memory controller die is configured to:
issue a write training command on the communication bus; and
issue a command to select the plurality of semiconductor dies for the write training.

19. The non-volatile memory system of claim 16, wherein:
the memory controller die is configured to send a seed pattern on the plurality of data lines to the plurality of semiconductor dies during the write training; and
the control circuit of each respective semiconductor die is configured to:
generate expected data based on the seed pattern; and
compare the expected data with the test data to determine the shortest delay for which data is validly received for each data line and the longest delay for which data is validly received for each data line.

20. The non-volatile memory system of claim 16, wherein the three-dimensional memory array comprises NAND strings.

\* \* \* \* \*